United States Patent [19]

Raulin et al.

[11] Patent Number: 4,520,491
[45] Date of Patent: May 28, 1985

[54] TRANSMISSION SYSTEM USING DIFFERENTIAL PULSE CODE MODULATION WITH ADAPTIVE PREDICTION

[75] Inventors: Jean M. Raulin, Noisy le Sec; Georges Bonnerot, Les Ulis, both of France

[73] Assignee: Telecommunications Radioelectriques et Telephoniques T. R. T., Paris, France

[21] Appl. No.: 439,146

[22] Filed: Nov. 4, 1982

[30] Foreign Application Priority Data

Nov. 4, 1981 [FR] France .................................. 81 20676

[51] Int. Cl.$^3$ ............................................. H03K 13/22
[52] U.S. Cl. ..................................... 375/27; 332/11 D; 364/724
[58] Field of Search ................. 375/27, 28, 29, 30, 375/31, 32, 33, 122; 332/11 D; 340/347 AD; 333/14; 381/29, 30, 31, 32; 364/724

[56] References Cited

U.S. PATENT DOCUMENTS

| | | | |
|---|---|---|---|
| 3,502,986 | 3/1970 | Lucky | 375/27 |
| 3,631,520 | 12/1971 | Atal | 375/27 |
| 3,825,831 | 7/1974 | Ishiguro | 332/11 D |
| 3,973,199 | 8/1976 | Widmer | 375/30 |
| 4,140,876 | 2/1979 | Gagnon | 381/30 |
| 4,354,273 | 10/1982 | Araseki et al. | 375/27 |
| 4,361,893 | 11/1982 | Bonnerot | 375/27 |
| 4,411,003 | 10/1983 | Su | 375/33 |

*Primary Examiner*—Robert L. Griffin
*Assistant Examiner*—Stephen Chin
*Attorney, Agent, or Firm*—Thomas A. Briody; William J. Streeter; Edward W. Goodman

[57] ABSTRACT

In this transmission system using differential PCM, the local decoder, incorporated in the loop of the encoder, and the remote decoder comprise identical filters (5) and (15) each constituted by a cascade arrangement of several filtering sections ($F_1$-$F_N$) of the first and/or of the second order; each section may have one or two controllable coefficients, which are modified at each sampling instant by a modification term which depends upon the product of the difference signal (e) produced in the encoder and the gradient of the difference signal (e) with respect to the controllable coefficient. When the filtering sections ($F_1$-$F_N$) are recursive, the gradients are obtained by applying a signal corresponding to the difference signal (e) to identical recursive sections ($F'_1$-$F'_N$). When non-recursive filtering sections ($H_1$-$H_L$) are used, the gradient calculation sections ($H'_1$-$H'_L$) are recursive with a transfer function inverse to that of the sections ($H_1$-$H_L$).

17 Claims, 11 Drawing Figures

TRANSMISSION SYSTEM USING DIFFERENTIAL PULSE CODE MODULATION WITH ADAPTIVE PREDICTION

BACKGROUND OF THE INVENTION

The invention relates to a digital information transmission system using differential pulse code modulation and comprising an encoder for converting an incoming linear PCM signal into a differential PCM signal with a reduced number of bits, and a remote decoder for carrying out the inverse conversion, the encoder comprising a difference circuit for forming a difference signal between the incoming linear PCM signal and a prediction signal, a quantizer for quantizing the difference signal to form the differential PCM signal, and a local decoder for receiving the differential PCM signal and forming the prediction signal, the local decoder and the remote decoder being constituted in the same manner and each comprising a quantizer, operating inversely to the quantizer of the encoder, and a filter constituted by a cascade arrangement of filtering sections, each section being provided with a round-off (or truncation) circuit operating with a step equal to the quantizing step of the differential PCM signal.

Such a transmission system using differential PCM is described in the French Patent Specification No. 2,441,971 of the Applicants.

It is known that the transmission of signals coded according to the differential PCM method enables a lower bit rate in a transmission path than in the event of these signals being coded according to the PCM method. If, for example, a standardized PCM signal of 8 bits is converted into a differential PCM signal of 4 bits, each being sampled at the same frequency of 8 kHz, the transmission according to the differential PCM method can be effected at a rate of 32 kbit/s instead of at the rate of 64 kbit/s required for the transmission according to the PCM method. However, modern digital telephone communication networks are designed for the transmission and the switching of standardized PCM signals of 8 bits. If the reduction of the bit rate offered by the transmission according to the differential PCM method should be utilized in the existing networks, a conversion of a PCM signal into a differential PCM signal has to be effected at the input of each transmission path, while the inverse conversion of a differential PCM signal into a PCM signal has to be effected at the output of each transmission path connected to a switching center. Thus, a telephone connection in a network constituted in this manner may render it necessary to carry out a cascade of conversions of PCM to differential PCM and inversely.

In the transmission system using differential PCM described in the French Patent Specification No. 2,441,971, the accumulation of noise produced at each conversion and the possible misalignment of the digital filters of the local decoder, and the remote decoder are avoided in that these filters are constituted by a cascade of filtering sections each having a round-off (or truncation) circuit operating with a step equal to the quantizing step of the difference signal formed in the encoder. Preferably, this quantizing step is variable and automatically adapted to the level of the difference signal in order that the latter is coded as best as possible with the reduced number of bits of the differential PCM signal.

However, it does not alter the fact that in the differential PCM transmission system considered, the conversion of the incoming PCM signal into a differential PCM signal produces a quantizing noise that has to be reduced as much as possible to improve the quality of the transmission. Since this quantizing noise is proportional to the difference signal which is quantized in the encoder, attempts must be made to reduce the difference signal as much as possible so as to obtain a prediction signal which approximates to the incoming PCM signal of the encoder as close as possible. It can be shown that the ideal prediction filter has a response which is the image of the spectrum of the signal to be transmitted. Now the signals to be transmitted may be of different nature: data or speech signals, and moreover a distinction has to be made, especially for the speech signals, between the long-term spectrum and the short-term spectrum for syllabic durations. In the French Patent Specification No. 2,441,971 it is recommended to use a fixed prediction filter constituted by a cascade of filtering sections of arbitrary order having, however, only a sole coefficient and providing a compromise response between these different spectra. However, such a fixed prediction filter is rarely welladapted to the signal at a given instant and does not always permit of obtaining the required transmission quality.

SUMMARY OF THE INVENTION

The present invention therefore has for its object to improve the transmission system of the kind described in the aforementioned French Patent Specification by providing an adaptive prediction filter, the coefficients of which are controlled so that its response is in conformance with the spectrum of the signal to be transmitted, while maintaining the advantages of this transmission system, especially those relating to the alignment of the digital filters and to the non-accumulation of the quantizing noise.

According to the invention, in this transmission system using differential PCM, the filters of the local decoder and the remote decoder comprise several filtering sections of the second order having two coefficients, at least one of which is controllable, the controllable coefficients of corresponding sections of the filter of the local decoder and the filter of the remote decoder being controlled by identical control circuits receiving a same signal derived from the differential PCM signal and comprising means for calculating the controllable coefficients by successive iterations so as to minimize a predetermined function of the difference signal produced in the encoder as well as means for testing, for each section and at each iteration, whether each controllable coefficient affected by a calculated modification term, is larger than an upper limit value or smaller than a lower limit value, these limit values being determined so that the poles (or the zeros) of the transfer function in Z of the section lie just inside the circle of unit radius, the modified value retained for the controllable coefficient being the nearest limit value when the test is positive and the value affected by the calculated modification term when the test is negative.

In the differential PCM transmission system according to the present invention, a limitation apparent from the prior French Patent Specification and concerning the number of coefficients of the filtering sections, is thus completely eliminated. With filtering sections of the second order having two coefficients and, as the case may be, one filtering section of the first order, a prediction filter of arbitrary order and having an arbitrary number of coefficients can be realized by the cascade arrangement of these sections. This possibility, in conjunction with the adaptivity of the filtering sections, permits approximating the ideal prediction filter very closely for any signal whatsoever that is to be transmitted.

On the other hand, the use of second-order sections in a cascade structure permits avoiding the complexity of the coefficient test necessary for obtaining a stable prediction filter. In fact, whatever the order N of the prediction filter may be, the stability of this filter is ensured if each constitutive section is stable and if the test relates to the two coefficients of each section, independently of the coefficients of the other sections. On the contrary, in the known differential PCM transmission systems employing adaptive prediction filters of the order $N>2$, the cascade structure is not utilized and the operations of testing the coefficients are complicated (the more so as N is large), because the limit values of the coefficients depend upon one another. It should be noted, for example, that in the French Patent Specification No. 2,463,549 disclosing an adaptive prediction filter of the order $N>2$, the testing of the coefficients is really described only for $N=2$.

It should finally be noted that an article by Jackson entitled "Linear Prediction in Cascade Form" published in IEEE Transactions, Vol. ASSP-26, No. 6, December 1978, pp. 518-528, discloses a linear adaptive predictor constituted also by a cascade arrangement of filtering sections of the second order with controllable coefficients. However, this predictor is used to deliver a prediction error for purposes other than transmission and could not be used in a differential PCM transmission system with a bit rate reduced with respect to the bit rate of the incoming PCM signal of the encoder. In fact, the Jackson predictor with transfer function H used in an encoder receiving a signal $x(n)$ and having the transfer function $1-H$ for supplying a difference signal $e(n)$, should be used in the case of differential PCM transmission with a remote decoder having the transfer function $1/(1-H)$ and receiving the difference signal $e'(n) \neq e(n)$ resulting from a quantizer Q at the output of the encoder for forming the differential PCM signal with a reduced number of bits and from an inversely operating quantizer $Q^{-1}$ at the input of the deocer. When $x'(n)$ denotes the signal supplied by the decoder, it can be shown that:

$$x(n) - x'(n) = [e(n) - e'(n)] \cdot \frac{1}{1-H}$$

which illustrates that with the Jackson system, the noise $[e(n)-e'(n)]$ produced by the two quantizers Q and $Q^{-1}$ would be amplified by the factor $1/(1-H)$, which is larger accordingly as the prediction is better $(H \to 1)$. On the contrary, due to the fact that in the system according to the invention, the encoder has a recursive structure which incorporates in its loop a local decoder identical to the remote decoder and comprising, in particular, the inversely operating quantizer $Q^{-1}$, no amplification of the noise $[e(n)-e'(n)]$ occurs. Finally, it should be noted that the Jackson predictor is constituted by a cascade of non-recursive sections which are always stable and that it is utilized in a non-recursive structure for forming the prediction error. As a result, the problem of the testing the predictor coefficients, which would necessarily arise in a transmission system, is not even contemplated for the Jackson predictor.

If in the transmission system according to the invention, the function of the difference signal to be minimized, is its mean square value, the modification terms of each controllable coefficient of the filtering sections of the local decoder and the remote decoder are calculated at each iteration as the product, weighted by a coefficient less than 1, of the signal derived from the differential PCM signal and the gradient of the difference signal with respect to the controllable coefficient, each gradient being formed in a gradient calculation circuit which receives the signal derived from the differential PCM signal and which is provided with a round-off (or truncation) circuit operating with a step signal to the quantizing step of the differential PCM signal.

In order to simplify the implementation of the filters of the local decoder and the remote decoder as well as of the circuits for controlling their coefficients, it is advantageous that these filters comprise at least one recursive filtering section answering to a transfer function in Z of the type $$g'(Z) = \frac{1}{1 - \beta(\delta Z^{-1} + Z^{-2})}$$

$\beta$ being a controllable coefficient and $\delta$ a fixed coefficient of a section, the gradient $G_\beta$ being obtained by applying the signal derived from the differential PCM signal to a recursive gradient calculation section answering to the transfer function $g'(Z)$ with a fixed coefficient $\delta$ approximately equal to that of the corresponding section of the filters of the local decoder and the remote decoder, the gradient being derived at a node of the gradient calculation section where the output signal of this section is multiplied by the function in Z of the type $(\delta Z^{-1}+Z^{-2})$.

The implementation of the gradient calculation sections is further simplified and the alignment of the filters of the local decoder and the remote decoder is facilitated, by causing the sections of these filters having the transfer function $g'(Z)$ with one controllable coefficient $\beta$, to be associated with gradient calculation sections having a transfer function of the same type, but with these two coefficients fixed.

It is also possible to utilized in the filters of the local decoder and the remote decoder, non-recursive filtering sections of the second order with two coefficients arranged in cascade with the preceding recursive filtering sections. It is advantageous that these non-recursive sections have only a sole controllable coefficient. The gradients required for the calculation of the modification terms of the coefficients of these non-recursive sections operating inversely to the non-recursive sections and having one or two fixed coefficients.

DESCRIPTION OF THE DRAWINGS

The following description with reference to the accompanying drawings, given by way of non-limitative example, permits understanding clearly how the invention can be realized.

DESCRIPTION OF THE PREFERRED EMBODIMENTS

Figure 1:
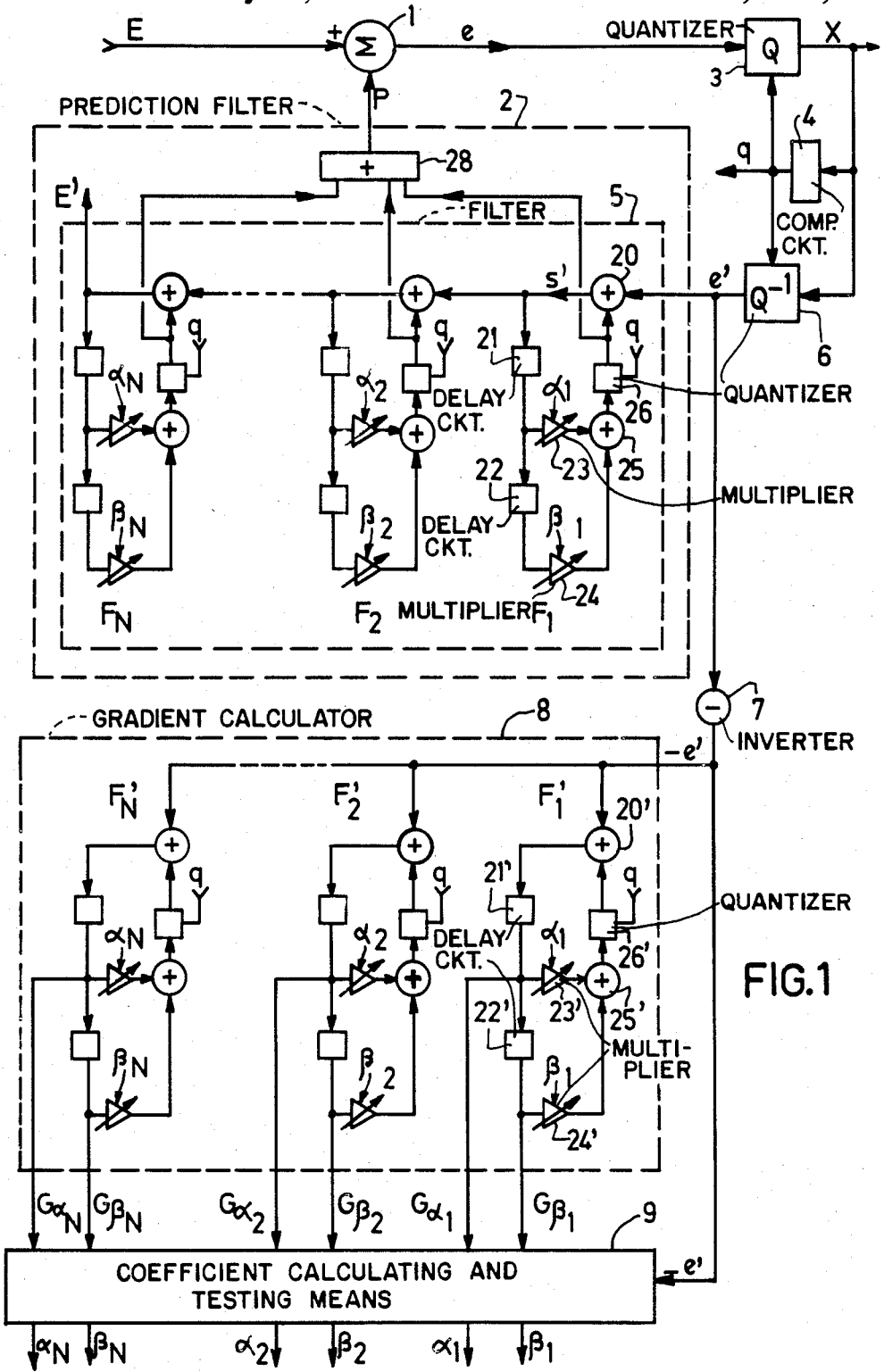
FIG. 1 shows an embodiment of a differential PCM encoder of a system according to the invention using recursive filtering sections with two controllable coefficients.
Figure 2:
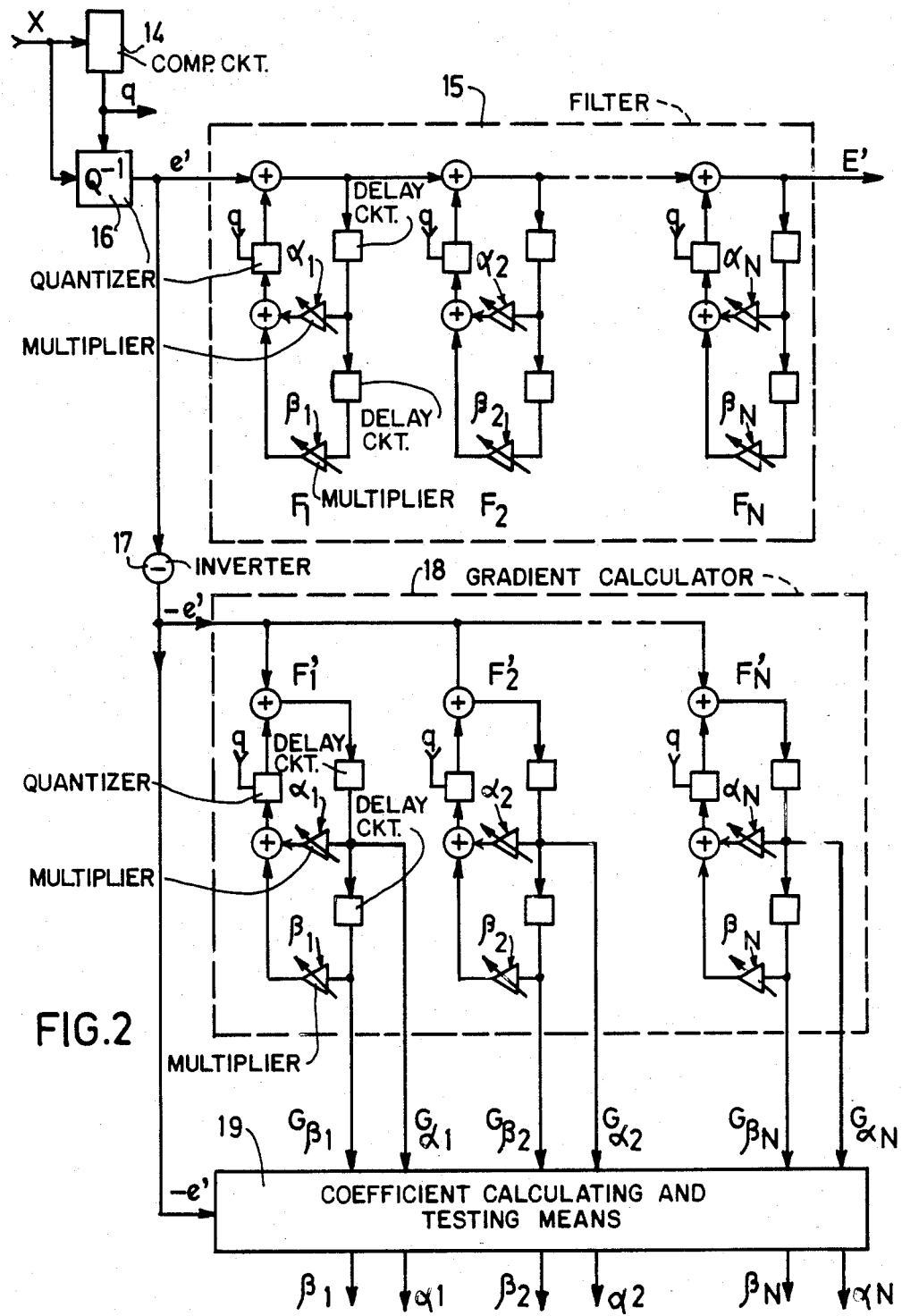
FIG. 2 shows the decoder to be associated with the encoder shown in FIG. 1.

FIGS. 1 and 2 show the encoder and the associated remote decoder, respectively, in a differential PCM transmission system. This encoder and this decoder are of the type described in the French Patent Specification No. 2,441,971 and are provided with the improvements according to the present invention.

In FIG. 1, the input of the encoder receives a PCM signal E formed by linearly encoded 12-bit samples and resulting, for example, from an expansion of a compressed 8-bit PCM signal generally utilized for transmission in digital communication networks. These samples appear at a rate of 8 kHz. A subtractor 1 forms a difference signal e between the linear incoming PCM signal E and a prediction signal P produced in a prediction filter 2, as will be explained hereinafter. The difference signal e is quantized according to a linear, or non-linear, law in a quantizer 3 by comparison with a given number of levels derived from a quantizing step q. This operation Q of quantizing the difference signal e results in a signal X which is encoded according to the differential PCM method and is to be transmitted. This signal X is constituted, for example, by samples of 4 bits appearing at the sampling rate of 8 kHz of the incoming PCM signal E.

It is advantageous that the magnitude of the quantizing step q be adapted to the level of the difference signal e in order to utilize the whole dynamic range of a 4-bit differential PCM signal with 4 bits as best as possible. For that purpose, use is made of a compression circuit 4 which is described, for example, in the French Patent Specification No. 2,441,971 and in which, starting from the signal X, a variable quantizing step q is generated which is applied to the quantizer 3 arranged for operating with such a variable step.

The differential PCM signal X is also applied to a quantizer 6 which performs a quantizing operation $Q^{-1}$, inverse to that performed in the quantizer 3 and also utilizes the variable quantizing step q from the compression circuit 4. The inversely operating quantizer 6 supplies a signal e' whose value approximates the difference signal e and which is applied to the prediction filter 2.

According the French Patent Specification No. 2,441,971, the prediction filter 2 comprises a filter 5 constituted by a cascade arrangement of filtering sections $F_1, F_2, \ldots F_N$ and receiving the signal e', each of which sections can be of the recursive or the non-recursive type. For a better understanding of the system, it may be assumed that the quantizer 6 and the filter 5 constitute the local decoder incorporated in the encoder; at the output of this filter 5, constituting the output of the local decoder, there appears a signal E' which has to be identical to the signal restituted by the remote decoder. In fact, the output signal E' of the local decoder is not used in the encoder. In this encoder, use is made of the prediction signal P, which is formed at the output of an adder 28, as the sum of signals derived in the filtering sections $F_1$ to $F_N$ at points that will be specified hereinafter.

FIG. 2 shows the remote decoder associated with the encoder shown in FIG. 1. This decoder receives, through the transmission medium, the differential PCM signal X supplied by the encoder and has to restitute a PCM signal having a value as close as possible to the incoming signal E of the encoder shown in FIG. 1. This remote decoder has the same structure as the local decoder incorporated in the encoder and has to be constituted by identical elements. It comprises a compression circuit 14 and an inverse quantizer 16, which are identical to the corresponding elements 4 and 6, respectively, of the encoder and which receive the differential PCM signa X. The compression circuit 14 supplies the variable quantizing step q to the inverse quantizer 16. The latter delivers the signal e' which is applied to a filter 15 identical to the corresponding filter 5 of the decoder incorporated in the encoder. Consequently, the filter 15 is constituted by the cascade arrangement of the same sections $F_1, F_2, \ldots F_N$ constituting the filter 5. At the output of the filter 15 there appears the restituted desired PCM signal E' identical to the signal which could have been obtained at the output of the cascade arrangement of the sections constituting the filter 5.

The French Patent Specification No. 2,441,971 recommends that, in order to solve the problems of alignment of the filters 5 and 15 during operation, the filtering sections $F_1, F_2, \ldots F_N$ of the recursive or the non-recursive type and of arbitrary order have only a sole coefficient differing from zero. In practice, it has now been found that this restriction as to the number of coefficients of each filtering section is not necessary for obtaining the alignment of the filters 5 and 15, that is to say, for ensuring that these filters, receiving the same signal e', under all conditions restitute the same signal E' after a reasonable convergence time. An improvement provided by the present invention consequently consists in that it is ensured that each filtering section $F_1, F_2$ or $F_N$ of the first or of the second order, while the sections of the second order may have two coefficients. With the possibility thus provided to utilize sections of the second order with two coefficients, i.e. the most general second-order sections, it will be clear to those skilled in the art that the filters 5 and 15, and consequently the prediction filter 2, can realize an arbitrary transfer function which can be represented generally, utilizing the Z transform, by a fraction whose numerator and denominator are polynominals in Z corresponding to the non-recursive part and the recursive part, respectively, of these filters. In fact, the recursive or non-recursive part of these filters is constituted most advantageously by a cascade arrangement of filters of the second order to which is joined a filter of the first order when the degree of the polynomial in Z is odd.

In FIGS. 1 and 2, the filtering sections $F_1, F_2, \ldots F_N$ are all represented as sections of the second order, of the recursive type, and each having the transfer function in Z of the type:

$$g(Z) = \frac{1}{1 - \alpha Z^{-1} - \beta Z^{-2}} \quad (1)$$

$Z^{-1}$ and $Z^{-2}$ corresponding to delays T and 2T, T being the sampling period, $\alpha$ and $\beta$ being filtering coefficients.

It is desirable for the following description to define the conditions which the coefficients $\alpha$ and $\beta$ have to satisfy in order that the recursive filter, represented by the transfer function g(Z), is stable. It is known that the stability condition of a recursive filter is that the poles of this transfer function in Z lie inside the circle of unit radius. It can be shown that the following conditions result for the coefficients $\alpha$ and $\beta$:

$$\begin{cases} |\beta| < 1 \\ -1 + \beta < \alpha < 1 - \beta \end{cases} \quad (2)$$

Figure 3:
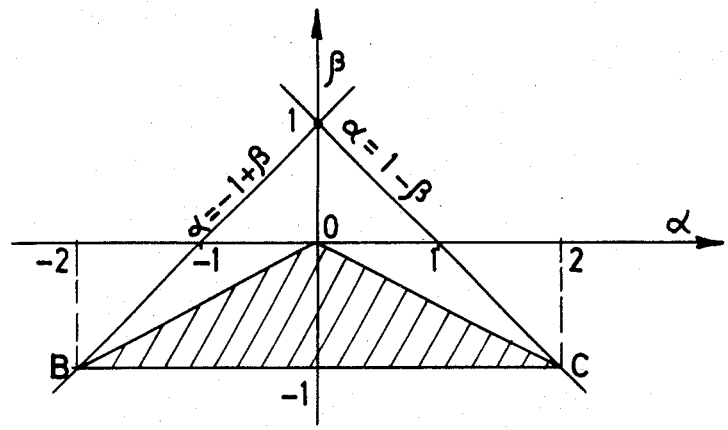
FIG. 3 shows a diagram illustrating the conditions to be satisfied for the two coefficients of each filtering section.

In the diagram of FIG. 3, in which the coefficients $\alpha$ and $\beta$ are plotted on the abscissa and on the ordinate, respectively, the conditions become manifest in that the point of co-ordinates $\alpha$ and $\beta$ has to lie inside the triangle bounded by the straight lines $\beta = -1$, $\alpha = -1+\beta$, $\alpha = 1-\beta$.

The section $F_1$ is constituted by an adder 20 which receives at a first input the signal e' entering the section and supplies the signal s' leaving the section. The signal s' is applied to delay circuits 21 and 22 arranged in cascade and each providing a delay T. The signal leaving delay circuit 21 is multiplied by the coefficient $\alpha_1$ with the aid of a multiplier 23, while the signal leaving delay circuit 22 is multiplied by the coefficient $\beta_1$ with the aid of a multiplier 24. The two products thus formed are summed in an adder 25 and the sum thus formed is rounded off (or truncated) by a quantizer 26 operating with a step equal to the quantizing step q produced by the compression circuit 4 in the encoder or by the compression circuit 14 in the decoder. The rounded (or truncated) signal is applied to a second input of the adder 20. The other filtering sections $F_2$ to $F_N$ arranged in cascade with the section $F_1$ are constituted in the same manner and utilize the pairs of coefficients $(\alpha_2, \beta_2)$ to $(\alpha_N, \beta_N)$, respectively.

With a filter 5 constituted by filtering sections of a second order arranged in cascade, the prediction signal P is obtained in a remarkably simple manner; this prediction signal P is obtained by forming, with the aid of an adder 28, the sum of the signals derived in the cascade arrangement of the sections $F_1$ to $F_N$ at nodes between the quantizers, such as 26, and the adders, such as 20.

Figure 4:
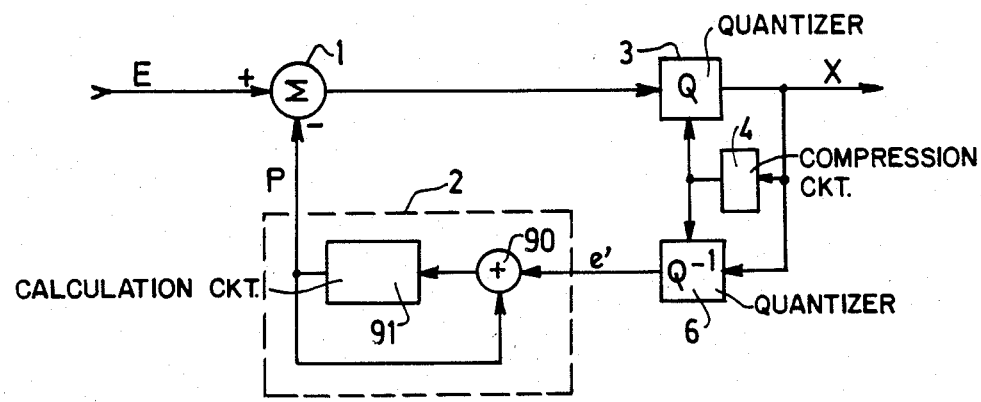
FIG. 4 shows a simplified circuit diagram of a differential PCM encoder.

It will be shown that the prediction signal may be formed effectively in this manner by utilizing the general circuit diagram of a differential PCM encoder shown in FIG. 4. In this circuit diagram, the elements 1, 2, 3, 4 and 6 are indicated again which are interconnected in the manner shown in FIG. 1. The prediction filter 2 is a recursive filter constituted by an adder 90 receiving at its two inputs the input signal e' of the filter and the output signal of a calculation circuit 91. The latter receives the output signal of the adder and supplies the prediction signal P. The calculation circuit 91 performs a summation of 2N successive samples which are applied to its input and are weighted; this calculation can be represented by the function in Z:

$$\sum_{i=1}^{2N} A_i Z^{-i},$$

$A_i$ being the weighting coefficients.

The transfer function $$H(Z) = \frac{X(Z)}{E(Z)}$$

of the encoder of FIG. 3 can then be written as:

$$H(Z) = \frac{Q}{1 + \dfrac{\sum_{i=1}^{2N} A_i Z^{-i}}{1 - \sum_{i=1}^{2N} A_i Z^{-i}}}$$

Otherwise, there can be written:

$$1 - \sum_{i=1}^{2N} A_i Z^{-i} = \prod_{i=1}^{N} (1 - \alpha_i Z^{-1} - \beta_i Z^{-2})$$

$\alpha_i$ and $\beta_i$ being pairs of coefficients derived from the coefficients $A_i$.

It can be verified that this results in the equality:

$$\prod_{i=1}^{N}(1 - \alpha_i Z^{-1} - \beta_i Z^{-2}) \, 1 - \sum_{j=1}^{N}(\alpha_j Z^{-1} +$$

$$\beta_j Z^{-2}) \prod_{i=j+1}^{N}(1 - \alpha_i Z^{-1} - \beta_i Z^{-2})$$

Under these conditions, the transfer function H(Z) can be written as follows:

$$H(Z) = \frac{Q}{1 + \sum_{j=1}^{N} \dfrac{\alpha_j Z^{-1} + \beta_j Z^{-2}}{\prod_{i=1}^{j}(1 - \alpha_i Z^{-1} - \beta_i Z^{-2})}}$$

The transfer function $$K(Z) = \frac{P(Z')}{e'(Z)}$$

of the prediction filter 2 consequently is:

$$K(Z) = \sum_{j=1}^{N} \frac{\alpha_j Z^{-1} + \beta_j Z^{-2}}{\prod_{i=1}^{j}(1 - \alpha_i Z^{-1} - \beta_i Z^{-2})}$$

It can readily be seen that this transfer function K(Z) of the prediction filter is realized exactly by the circuit diagram of the prediction filter 2 shown in FIG. 1; this filter comprises a cascade arrangement of recursive sections of the second order for processing the input signal e' and an adder for forming a prediction signal P as the sum of signals derived in the filtering sections, each of these derived signals being the signal in a respective filtering section which is added to the input signal of this section.

In the case that the prediction filter is of the non-recursive type, it can be shown that the prediction filter can be constituted in an analogous manner with the aid of a cascade arrangement of non-recursive sections of the second order and an adder forming the prediction signal P in the same manner, that is to say as the sum of signals, each of which is the signal in a respective filtering section which is added to the input signal of this section.

If the prediction filter comprises a recursive part and a non-recursive part, the prediction filter is then constituted by a cascade arrangement of recursive and non-recursive sections, which may be arranged in the order most favorable for simplicity of realization; the prediction signal is then formed as the sum of signals derived in the recursive and non-recursive sections in the same manner as specified above.

The circuit diagram of the recursive filtering sections of the second order with two coefficients can readily be changed to that of sections with a single coefficient. Thus, the circuit diagram of a section of the first order is obtained by suppressing the branch of multiplication by the coefficient $\beta_1$ while the circuit diagram of a section of the second order with a single coefficient is obtained by suppression the branch of multiplication by the coefficient $\alpha_1$. What will be explained hereinafter for the sections with two coefficients, of course, also applied for the sections with a single coefficient, taking account of the suppressed branch in the section.

The present invention also provides an adaptive prediction filter comprising means for controlling the coefficients of the filtering sections $F_1$ to $F_N$ in the encoder and in the remote decoder in order to reduce the difference signal e formed in the encoder and hence the quantizing noise of the differential PCM signal X.

The criterion used for the control of the coefficients is advantageously the minimization of the mean square value of the difference signal e, which can be written as $M|e|^2$, M being an operator indicating that the mean value of the following quantity is taken.

This quantity $M|e|^2$ can be minimized by successive iterations utilizing the algorithm of the gradient for controlling the coefficients $\alpha_i$ and $\beta_i$ of the filtering sections $F_i$ (i being an integer with $1 \leq i \leq N$). The iteration formulae corresponding to this algorithm have the form:

$$\alpha_i(n+1) = \alpha_i(n) - \frac{1}{2K_1} \frac{\partial M|e|^2}{\partial \alpha_i} \quad (3)$$

$$\beta_i(n+1) = \beta_i(n) - \frac{1}{2K_2} \frac{\partial M|e|^2}{\partial \beta_i} \quad (4)$$

These formulae, in which $K_1$ and $K_2$ are fixed coefficients such that $$\frac{1}{2K_1} \text{ and } \frac{1}{2K_2}$$

are smaller than 1, indicate the modifications to be introduced in the coefficients $\alpha_i(n)$ and $\beta_i(n)$ at the iteration n in order to obtain the coefficients $\alpha_i(n+1)$ and $\beta_i(n+1)$ and the iteration $(n+1)$. Advantageously, these modifications can be calculated and effected at each sampling instant of the difference signal e.

When the modification terms of the coefficients in the formulae (3) and (4) are developed, the latter can be written as:

$$\alpha_i(n+1) = \alpha_i(n) - \frac{1}{K_1} M\left[ e \cdot \frac{\partial e}{\partial \alpha_i} \right]$$

$$\beta_i(n+1) = \beta_i(n) - \frac{1}{K_2} M\left[ e \cdot \frac{\partial e}{\partial \beta_i} \right]$$

If the coefficients $K_1$ and $K_2$ are large with respect to 1, the modifications introduced in the coefficients at each iteration are very small, and it is then practically superfluous to perform the calculation of the mean value indicated by the operator W. On the other hand, for the gradients of the difference signal with respect to the coefficients $\alpha_i$ and $\beta_i$, it is assumed:

$$\frac{\partial e}{\partial \alpha_i} = G_{\alpha i}$$

$$\frac{\partial e}{\partial \beta_i} = G_{\beta i}$$

The iteration formulae to be implemented in practice for controlling these coefficients can finally be written as:

$$\alpha_i(n+1) = \alpha_i(n) - \frac{1}{K_1} \cdot e \cdot G_{\alpha i} \quad (5)$$

$$\beta_i(n+1) = \beta_i(n) - \frac{1}{K_2} \cdot e \cdot G_{\beta i} \quad (6)$$

It will now be shown how the gradients $G_{\alpha i}$ and $G_{\beta i}$ can be expressed in a form that can easily be implemented. When using formula (1) giving the transfer function of a recursive section, it can readily be found that the following relation exists between the input signal e' and the output signal E' of a filter 5 or 15:

$$e' = E'(1-\alpha_1 Z^{-1} - \beta_1 Z^{-2})(1-\alpha_2 Z^{-1} - \beta_2 Z^{-2}) \ldots (1-\alpha_N Z^{-1} - \beta_N Z^{-2}) \quad (7)$$

As has already been stated, e' is very close to the difference signal e. If e is equated to e', it can be verified that E=E' is obtained. Under these conditions, according to the preceding formula, the difference signal e can be written as:

$$e = E(1-\alpha_1 Z^{-1} - \beta_1 Z^{-2})(1-\alpha_2 Z^{-1} - \beta_2 Z^{-2}) \ldots (1-\alpha_N Z^{-1} - \beta_N Z^{-2}) \quad (8)$$

From formula (8) can be derived that the gradients $G_{\alpha i}$ and $G_{\beta i}$ can be written respectively as:

$$\begin{cases} G_{\alpha 1} = \frac{\partial e}{\partial \alpha_1} = \frac{-eZ^{-1}}{1 - \alpha_1 Z^{-1} - \beta_1 Z^{-2}} \\ G_{\alpha 2} = \frac{\partial e}{\partial \alpha_2} = \frac{-eZ^{-1}}{1 - \alpha_2 Z^{-1} - \beta_2 Z^{-2}} \\ \vdots \\ G_{\alpha N} = \frac{\partial e}{\partial \alpha_N} = \frac{-eZ^{-1}}{1 - \alpha_N Z^{-1} - \beta_N Z^{-2}} \end{cases} \quad (9)$$

$$\begin{cases} G_{\beta 1} = \frac{\partial e}{\partial \beta_1} = \frac{-eZ^{-2}}{1 - \alpha_1 Z^{-1} - \beta_1 Z^{-2}} \\ G_{\beta 2} = \frac{\partial e}{\partial \beta_2} = \frac{-eZ^{-2}}{1 - \alpha_2 Z^{-1} - \beta_2 Z^{-2}} \\ \vdots \\ G_{\beta N} = \frac{\partial e}{\partial \beta_N} = \frac{-eZ^{-2}}{1 - \alpha_N Z^{-1} - \beta_N Z^{-2}} \end{cases} \quad (10)$$

The formulae (9) show that the gradients $G_{\alpha 1}$, $G_{\alpha 2}$ ... $G_{\alpha N}$ can be obtained by applying the signal $-e$ to recursive sections identical to the sections $F_1$, $F_2$ ... $F_N$ and by delaying by T the output signal of these sections. The formulae (10) show that the gradients $G_{\beta 1}$, $G_{\beta 2}$ ... $G_{\beta N}$ can be obtained by delaying by 2T the output signal of the same sections.

In practice, the gradient calculation formulae (9) and (10) and the iteration formulae (5) and (6) are used by utilizing instead of the difference signal e which is available only in the encoder, the signal e' which is available both in the encoder and in the remote decoder at the output of the inverse quantizers 6 and 16 respectively.

These formulae are used in the encoder in the manner shown in FIG. 1. The signal e' available at the output of the quantizer 6 is changed as to sign in a circuit 7 and the signal $-e'$ is applied to a circuit 8, in which the gradients $G_{\alpha i}$ and $G_{\beta i}$ are calculated by applying the signal $-e'$ to filtering sections $F'_1$, $F'_2$ ... $F'_N$ identical to the sections $F_1$, $F_2$ ... $F_N$ and hence also recursive. Thus, the sections $F'_1$ is constituted by the elements 20' to 26', identical to the elements 20 to 26 of the section $F_1$. Attention should be paid especially to the presence in the section $F'_1$ of the quantizer 26' for rounding off (or truncating) the signal in the section with the variable step q. The gradient $G_{\alpha 1}$ is obtained at the output of delay circuit 21' delaying by T the output signal of section $F'_1$. The gradient $G_{\beta 1}$ is obtained at the output of delay circuit 22' producing an additional delay by T. The other gradients are obtained in the same manner in the sections $F'_2$ ... $F'_N$. The signal $-e'$ and the gradients $G_{\alpha i}$ and $G_{\beta i}$ thus calculated are applied to a circuit 9, in which the variable coefficients $\alpha_i$ and $\beta_i$ are calculated according to the iteration formulae (5) and (6), the conditions (2) with respect to the stability of the filtering sections being satisfied. The coefficients $\alpha_i$ and $\beta_i$ are utilized in the sections $F_i$ and $F'_i$, in which they are applied to variable multipliers, such as 23, 23' and 24, 24'.

In the remote decoder, the recursion formulae (5) and (6) and the gradient calculation formulae (9), (10) are used in the same manner as in the encoder on the basis of the signal e' appearing at the output of the quantizer 16. The decoder comprises the circuis 17, 18 and 19, identical to the circuits 7, 8 and 9 of the encoder and connected in the same manner to supply the same coefficients $\alpha_i$ and $\beta_i$.

Figure 5:
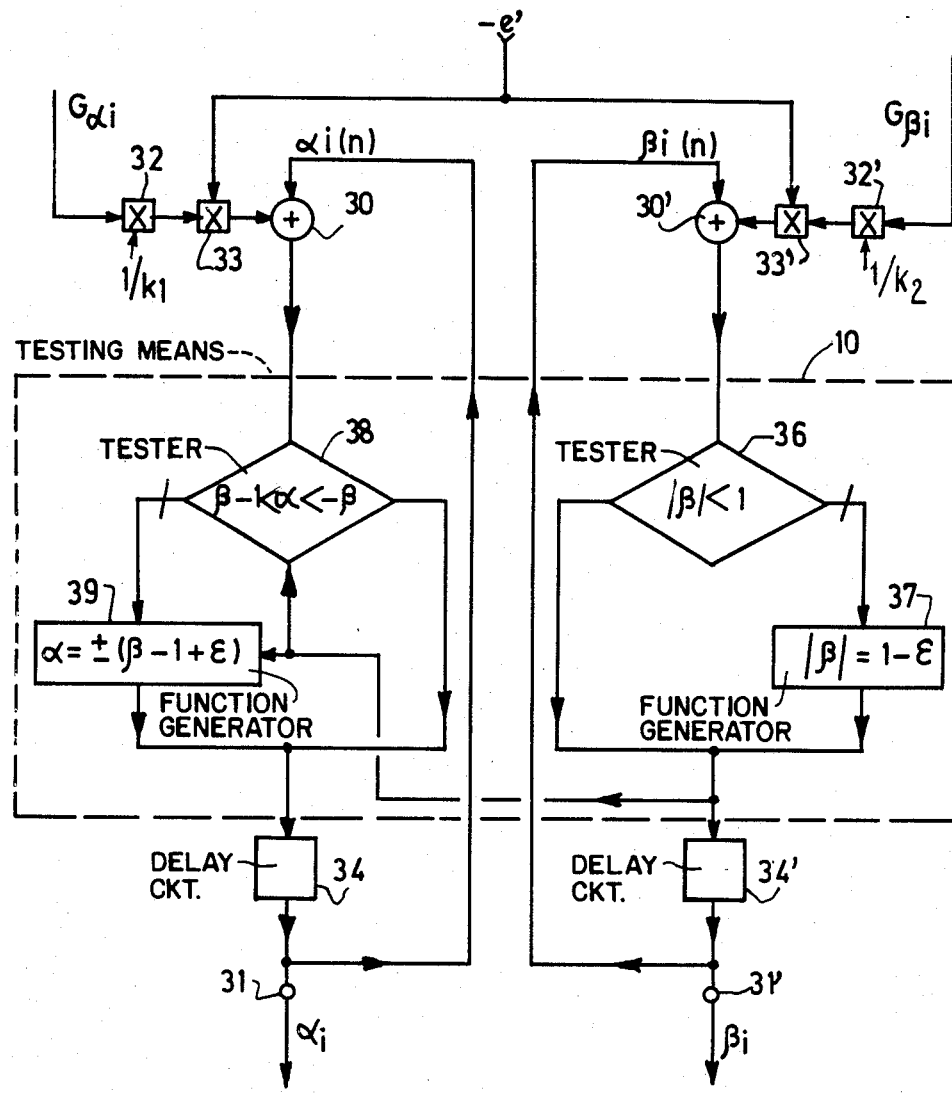
FIG. 5 shows a circuit diagram illustrating the functions to be fulfilled in the coefficient control circuits of the filtering sections with controllable coefficients.

FIG. 5 shows the structure of the circuit 9 (or 19) for processing the coefficients $\alpha_i$ and $\beta_i$ on the basis of the gradients $G_{\alpha i}$ and $G_{\beta i}$ and the signal $-e'$. For processing the coefficients $\alpha_i$ according to the formula (5), this circuit 9 comprises an adder 30 receiving at a sampling instant nT, on the one hand, a coefficient $\alpha_i(n)$ appearing at an output 31 of circuit 9 and, on the other hand, the modification term of this coefficient. This modification term is formed on the basis of the value of the gradient $G_{\alpha i}$ at the instant nT, which value is multiplied by the constant term $1/K_1$ in a multiplier 32. The product thus formed is multiplied by the value of the signal $-e'$ at the instant nT with the aid of a multiplier 33. The output of the latter is connected to the adder 30. The output of this adder forms a new calculated value of the coefficient, which is applied to a circuit 10 for verifying the stability conditions (2). A first output of this circuit 10 supplies an ultimate value of the coefficients $\alpha_1$ which, delayed by a time T in a delay circuit 34, will be utilized at the next sampling instant (n+1)T. For processing the coefficients $\alpha_i$ according to the formula (6), the circuit 9 utilizes the gradients $G_{\beta i}$ and comprises elements 30' to 34' having the same function as the elements 30 to 34 described above, multiplier 32' performing, however, a multiplication by the constant term $1/K_2$. A new calculated value of a coefficient $\beta_i$ appears at the output of adder 30' and is applied to the circuit 10 for verifying the stability conditions (2). A second output of this circuit 10 supplies an ultimate value of the coefficient $\beta_i$ to be utilized at the instant (n+1)T after a delay in circuit 34'.

In circuit 10, coefficients $\alpha_i$ and $\beta_i$, satisfying the stability conditions (2) of the filtering sections, are obtained according to the flow chart indicated inside circuit 10, which flow chart can readily be implemented by those skilled in the art. The calculated values $\beta$ of the coefficients $\beta_i$ appearing at the output of adder 30', are applied to a comparator 36 which decides whether $|\beta| < 1$. If this condition is satisfied, the value $\beta$ can be utilized as an ultimate value of the coefficient $\beta_i$. If this condition is not satisfied, the ultimate value retained for the coefficients $\beta_i$ is such that $|\beta| = 1 - \epsilon$ (box 37), $\epsilon$ being small with respect to 1. The values $\alpha$ of the coefficients $\alpha_i$ appearing at the output of adder 30 are applied to a comparator 38 which decides whether $\beta - 1 < \alpha < -\beta + 1$, the values of $\beta$ to be utilized being the ultimate values supplied by the other branch of circuit 10. If this condition is satisfied, the value $\alpha$ can be utilized as the ultimate value of the coefficient $\alpha_i$. If this condition is not satisfied, the ultimate value retained for the coefficient $\alpha_i$ is the limit value $\alpha = \beta - 1 + \epsilon$ or $-\beta + 1 - \epsilon$ (box 39), according as $\alpha$ is negative or positive.

It is clear to those skilled in the art that a single circuit, such as that shown in FIG. 5, can be utilized for modifying all the coefficients $\alpha_i$ and $\beta_i$ by ensuring that this circuit processes all the pairs of coefficients ($\alpha_i$, $\beta_i$) successively during a period T.

Finally, as is generally known in circuits of this kind using iteration formulae for modifying coefficients, the rather complicated operations required for calculating the modification terms of the coefficients occurring in the formulae (5) and (6) can be avoided. Instead of utilizing the magnitude and the sign of the gradients $G_{\alpha i}$ and $G_{\beta i}$ and and the signal $-e'$, it is possible to utilize only the sign for determining whether an increase or a decrease of the coefficient $\alpha_i$ or $\beta_i$ has to be effected. If the gradient has the same sign as the signal $-e'$, an increase of the coefficient has to be effected, whereas if the gradient has a sign differing from the signal $-e'$, a decrease of the coefficient has to be effected. The complexity of the calculation circuits in circuit 9 can thus be reduced considerably, but at the cost of an increase of the time of convergence of the coefficients to their local value, because the increases and decreases of the coefficients have always the same value, which has to be very small.

The operations of verifying the coefficients in circuit 10 for obtaining the coefficients of the filtering sections still remain comparatively complicated. According to a modification of the invention, it is advantageous to utilize filtering sections $F_1$ to $F_N$ having a different structure in order to simplify these operations. This novel structure is based on a change of the variable for the coefficients in the transfer function in Z of the section, for example, in the transfer function $g(Z)$ of a recursive section of the second order defined in formula (1). It can be written:

$$g(Z) = \frac{1}{1 - \alpha Z^{-1} - \beta Z^{-2}} = \frac{1}{1 - \beta\left(\frac{\alpha}{\beta} Z^{-1} + Z^{-2}\right)}$$

Putting $\delta = \alpha/\beta$, the function $g(Z)$ is written as:

$$g'(Z) = \frac{1}{1 - \beta(\delta Z^{-1} + Z^{-2})} \tag{11}$$

With this change of variable, the two coefficients of the recursive section defined by $g'(Z)$ become $\beta$ and $\delta$.

The conditions to be verified for these coefficients as to the stability of the section become:

$$\begin{cases} |\beta| < 1 \\ |\delta| < \frac{|1 - \beta|}{|\beta|} \end{cases} \tag{12}$$

The verification of the stability conditions may be simplified by a limitation to the negative values of $\beta$. The conditions (12) then become:

$$\begin{cases} -1 < \beta \leq 0 \\ -2 \leq \delta \leq 2 \end{cases} \tag{13}$$

With the conditions (13), the two coefficients $\alpha$ and $\beta$ can be verified independently of one another, which is a considerable simplification of this verification. In the diagram of FIG. 3, the conditions (13) mean that the point of co-ordinates $\alpha$ and $\beta$ has to lie inside the cross-hatched triangle OBC.

Figure 6:
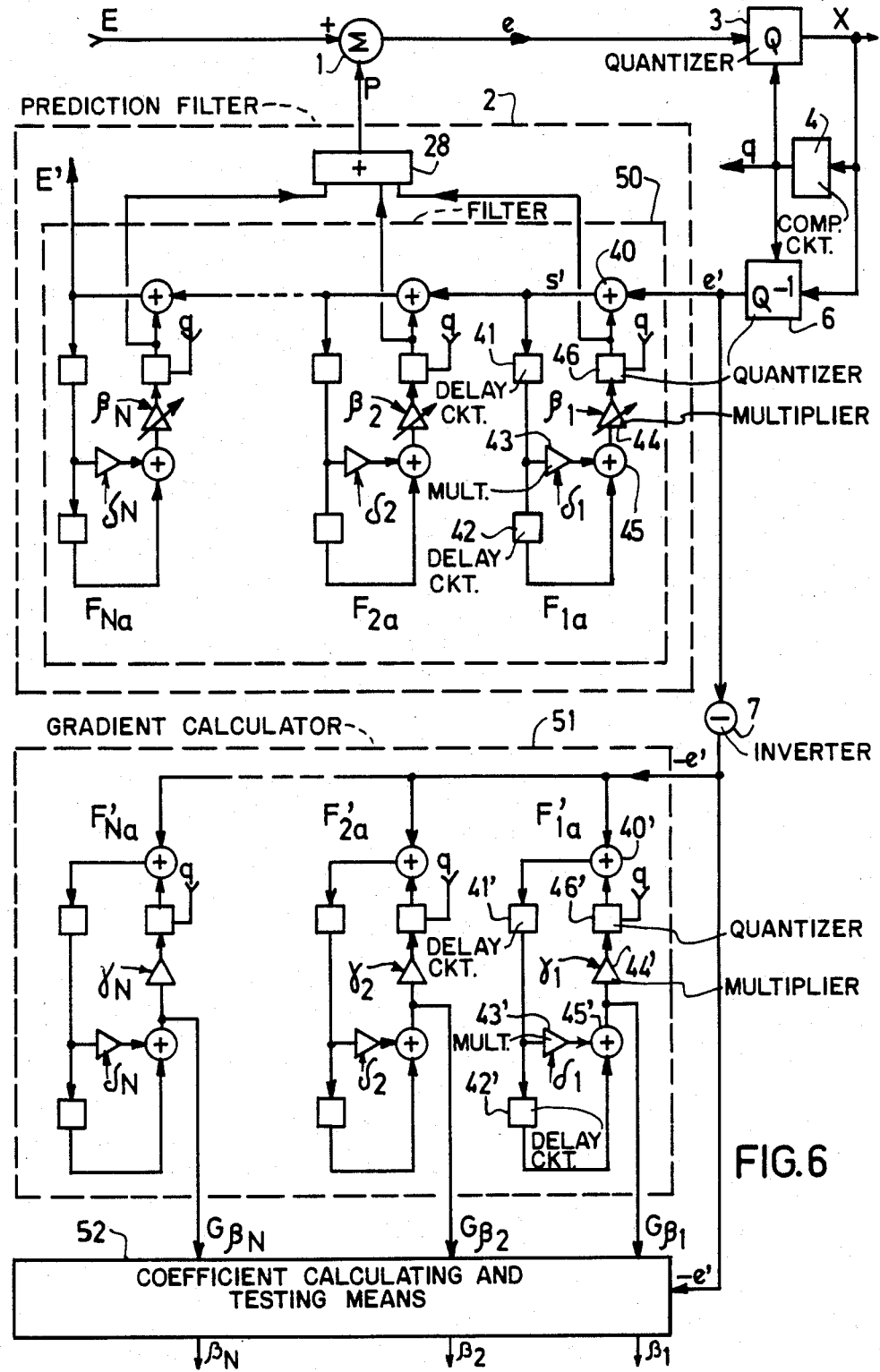
FIG. 6 shows an embodiment of the differential PCM encoder of the system according to the invention using a single controllable coefficient in the recursive sections of the encoder and two fixed coefficients in the gradient calculation sections.
Figure 7:
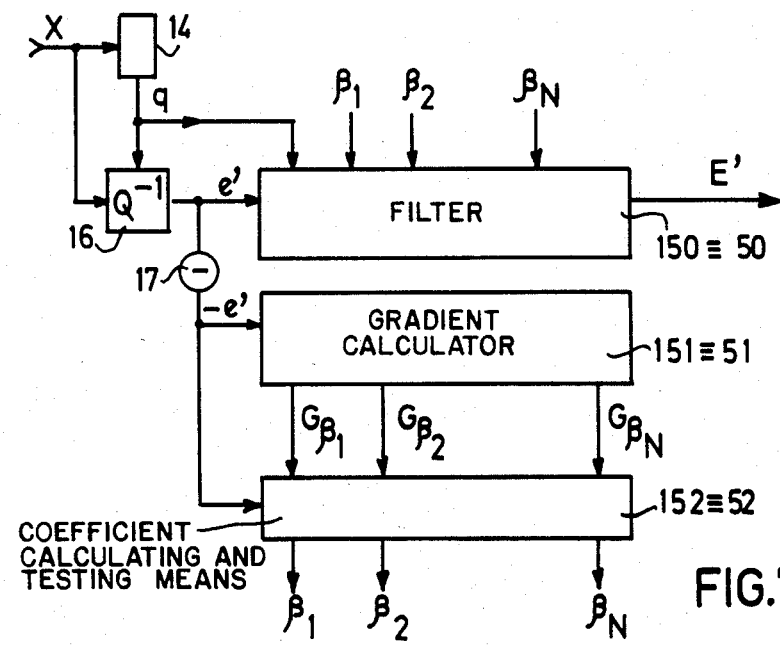
FIG. 7 shows the decoder to be associated with the encoder shown in FIG. 6.

FIGS. 6 and 7 show the encoder and the remote decoder, respectively, utilizing recursive filtering sections of the type represented by the transfer function $g'(Z)$ of the formula (11). In these Figures, a certain number of elements identical to those of FIGS. 1 and 2 are indicated by the same reference numerals.

According to FIG. 6, the prediction filter 2 of the encoder comprises a filtering assembly 50 consituted by the cascade arrangement of recursive sections $F_{1a}$, $F_{2a}$ ... $F_{Na}$ each having the transfer function of formula (11). The filtering section $F_{1a}$ is constituted by an adder 40, which receives the input signal $e'$ and supplies the signal $s'$. The latter is applied to delay two circuits 41 and 42 connected in cascade and each providing a delay by T. The signal leaving delay circuit 41 is multiplied by the coefficient $\delta_1$ in a multiplier 43 and the product thus formed is added to the signal leaving delay circuit 42 with the aid of an adder 45. The sum thus obtained is multiplied by the coefficient $\beta_1$ with the aid of a multiplier 44. The signal supplied by circuit 44 is applied to adder 40 through a quantizer 46, which rounds off (or truncates) the signal applied thereto with a step equal to the quantizing step q produced by compression circuit 4. The other sections $F_{2a}$ to $F_{2N}$ are constituted in the same manner and utilize the coefficients $(\beta_2, \delta_2) \ldots (\beta_N, \delta_N)$. The prediction signal P is obtained in the same manner as in the encoder of FIG. 1 by forming, with the aid of adder 28, the sum of the signals obtained at the output of the quantizers, such as 46. It has been found in practice that, with sections having this structure, a sufficient adaptation of the prediction signal P to the incoming PCM signal E can be obtained to reduce the difference signal e by utilizing in the filtering sections $F_{1a}$ to $F_{Na}$ a single set of variable coefficients, i.e. the coefficients $\beta_1$ to $\beta_N$, whereas the set of coefficients $\delta_1$ to $\delta_N$ can be fixed coefficients with properly distributed values. The calculations in the filtering sections can then be performed in a considerably simpler manner. Only the multipliers by the coefficients $\beta_1$ to $\beta_N$ perform complicated multiplications by variable coefficients. If the fixed coefficients $\delta_1$ to $\delta_N$ are chosen as powers of two, the corresponding multiplications consist of simple shifts and are practically gratuitous. Moreover, according to the conditions (13), if values $\delta$ of the coefficients $\delta_i$ are chosen such that $-2 \leq \delta_i \leq +2$, the stability of the sections is obtained by simply verifying that the values $\beta$ of the variable coefficients $\beta_i$ are such that $-1 < \beta \leq 0$. In a practical embodiment of the filtering assembly 50, five filtering sections have been utilized having variable coefficients $\beta_1$ to $\beta_5$ and fixed coefficients $\delta_1$ to $\delta_5$ of values equal to $<2$, $-1$, $0$, $1$ and $2$, respectively.

The variable coefficients $\beta_i$ of the sections just described may also be controlled by successive iterations according to an iteration formula analogous to formula (6), i.e.:

$$\beta_i(n + 1) = \beta_i(n) - \frac{1}{k} \cdot e \cdot G_{\beta i} \tag{14}$$

In this formula (14), k is a coefficient large with respect to 1 and $G_{\beta i}$ is the gradient of the difference signal e with respect to a coefficient $\beta_i$. It can be shown, by calculations utilizing the transfer function $g'(Z)$ of formula (11), that this gradient can be written as:

$$G_{\beta i} = \frac{\partial e}{\partial \beta_i} = -e \frac{\delta_i Z^{-1} + Z^{-2}}{1 - \beta_i(\delta_i Z^{-1} + Z^{-2})} \tag{15}$$

This formula (15) shows that the gradients $G_{\beta i}$ required for implementing the recursion formula (14) can be obtained by applying the signal $-e$ to gradient calculation sections identical to the sections $F_{ia}$ of the prediction filter and by deriving the signal at a node of these gradient calculation sections at which the outgoing signal is multiplied by $(\delta_i Z^{-1} + Z^{-2})$. In practice, in the gradient calculation sections and in the sections of the prediction filter, fixed coefficients $\delta_i$ may be utilized having slightly differing values without the adaptation of the prediction filter being substantially adversely affected.

For reasons which will be explained hereinafter, it is also possible to use, for the calculations of the gradients, sections having the same structure as the section $F_{ia}$ of the prediction filter, but in which the variable coefficients $\beta_i$ are replaced by fixed coefficients $\gamma_i$. The transfer function of these gradient calculation sections is then written as:

$$g''(Z) = \frac{1}{1 - \gamma_i(\delta_i Z^{-1} + Z^{-2})} \qquad (16)$$

These sections supply an approximate value of the gradients $G_{\beta i}$ according to the expression:

$$G_{\beta i} = -e \frac{\delta_i Z^{-1} + Z^{-2}}{1 - \gamma_i(\delta_i Z^{-1} + Z^{-2})} \qquad (17)$$

FIG. 6 shows how the formulae (15) or (17) and the recursion formula (14) are utilized in the encoder. The signal $e'$ utilized instead of the signal $e$ is changed as to its sign in circuit 7 and the signal $-e'$ is applied to a circuit 51, in which gradients $G_{\beta i}$ are calculated. The signal $-e'$ is applied to the filtering sections $F'_{1a}$ to $F'_{Na}$ having the same structure as the sections $F_{1a}$ to $F_{Na}$. The section $F'_{1a}$, for example, is composed of the elements $40'$ to $46'$ identical to the elements 40 to 46 of the section $F_{1a}$; the gradient $G_{\beta 1}$ is derived therefrom according to the formulae (15) or (17) at the output of adder $45'$. Multiplier $43'$ performs a multiplication by the same fixed coefficients $\delta_1$ as that utilized by multiplier 43. On the contrary, when it is assumed that formula (17) is utilized for the calculation of the approximate gradients, multiplier $44'$ performs a multiplication by a fixed coefficient $\gamma_1$ instead of the variable coefficient $\beta_1$ utilized in the section $F_{1a}$. The other filtering sections $F'_{2a}$ to $F'_{Na}$ are constituted in the same manner as the section $F'_{1a}$ and form in the same manner, by utilizing the coefficients $\delta_2$ to $\delta_N$ and $\gamma_2$ to $\gamma_N$, the gradients $G_{\beta 2}$ to $G_{\beta N}$.

The signal $-e'$ and the gradients $G_{\beta i}$ thus calculated are applied to a circuit 52, in whih the coefficients $\beta_i$ are processed according to the iteration formula (14), the stability condition of the filtering sections being satisfied. The implementation of this iteration formula (14) may be effected according to the right-hand part of the circuit diagram of FIG. 5 relating to the calculation of the coefficients $\beta_i$. As already has been explained, these calculations may be simplified considerably if only the sign of the gradients and of the signal $(-e')$ is utilized. According to the conditions (13) for the stability of the sections, the calculated values of the coefficients $\beta_i$ are utilized directly at the output of circuit 52 if their value $\beta$ is such that $-1 < \beta \leq 0$; if this condition is not satisfied, the coefficients $\beta_i$ is given the value 0 or $-1+\epsilon$.

FIG. 7 shows the circuit diagram of the local decoder associated with the encoder shown in FIG. 6. It comprises a filter 150 identical to filter 50 of the encoder and supplying the signal E', a circuit 151 identical to circuit 51 of the encoder and supplying the gradients $G_{\beta i}$ and finally a circuit 152 identical to circuit 52 of the encoder and supplying the variable coefficient $\beta_i$, which are utilized in filter 150.

The use of fixed coefficients $\gamma_i$ in gradient calculation sections $F'_{ia}$ instead of the variable coefficients $\beta_i$ gives only an approximate value of the gradients $G_{\beta i}$; however, with this approximation, coefficients $\beta_i$ very close to their ideal values are obtained in practice, which finally leads to a very satisfactory adaptation of the prediction signal P to the incoming PCM signal E. However, besides an evident advantage of a simple realization, this method has the advantage of materially reducing the time of alignment of filter 50 of the encoder (or prediction filter 2) and filter 150 of the decoder after a misalignment caused by the establishment of the connection or by a line error. In fact, the filters 50 and 150 of the encoder and the decoder cannot be aligned before their variable coefficients $\beta_i$ are identical, which can be achieved only if the gradient calculation sections of the encoder and of the decoder are aligned; this alignment of the gradient calculation sections can thus take much time if variable coefficients $\beta_i$ are utilized to this end. On the contrary, if fixed coefficients $\gamma_i$ are used, the filters 50 and 150 can be practically aligned after only their own time of alignment.

In the encoder and the decoder according to FIGS. 6 and 7 utilizing in the sections $F_{ia}$ and $F'_{ia}$ fixed coefficients $\gamma_i$ and $\delta_i$, the multiplications by these coefficients can be almost gratuitous if for these coefficients simple values, such as powers of two, are used. However, in the sections $F_{ia}$, the multiplications by the variable coefficients $\beta_i$ have still to be performed which may be complicated. In order to simplify in these sections $F_{ia}$ the multiplications by the coefficients $\beta_i$, it is evidently advantageous that the latter have a reduced number of bits, otherwise, the calculations to be performed in circuits 52 and 152 for obtaining the variable coefficients $\beta_i$ have to be effected with precision. It is then advantageous to perform these calculations on an auxiliary variable designated as an index and defined with a number of bits larger than that the coefficients $\beta_i$. These coefficients may be read from a table as a function of the value I of the index. This method also permits readily giving the coefficients a value $\beta$ corresponding to the stability conditions of the sections $(-1 < \beta \leq 0)$. The method moreover may permit readily establishing, between the values $\beta$ of the coefficients and the value I of the index, a non-linear law, which may be advantageous.

Otherwise it may be advantageous, as regards alignment problems of the filters 50 and 150 of the encoder and the decoder, to make the modification terms of the coefficients dependent not only upon the gradients $G_{\beta i}$, as indicated by the general iteration formula (14), but also upon the coefficients themselves. This is particularly useful when, for the modification of the coefficients, only the sign of the gradients $G_{62\ i}$ and the sign of the signal $-e'$ are utilized. When operating in this manner, modifying the coefficients $\beta_i$ of the encoder and the decoder by the same amount irrespective of the value of these coefficients, there is a risk that an initial difference between the corresponding coefficients of the encoder and the decoder is maintained indefinitely.

This disadvantage may be avoided by making the modification terms of the coefficients adequately dependent upon the value of the coefficients themselves. In the technique using the index and table loop-up of the coefficients, the index I may, for instance, be calculated by one or the other of the following iteration formulae:

$$I(n + 1) = I(n) + A \qquad (18)$$

$$I(n + 1) = I(n) - A \frac{I(n)}{L} \qquad (19)$$

Accordingly, as a coefficient $\beta_i$, lying between 0 and $-1$, has to be increased or decreased in absolute value as a function of the respective signs of the gradients $G_{\beta i}$ and the signal $-e'$, the iteration formula (18) or (19) is used. A and L are constant terms which determine the modifications of the index. The values of this index are moreover bounded by the values $I_{min}$ and $I_{max}$. In a practical realization of these iteration formulae, for example, the following values are used: $A=512$, $L=128$, $I_{min}=0$, $I_{max}=65536$.

Figure 8:
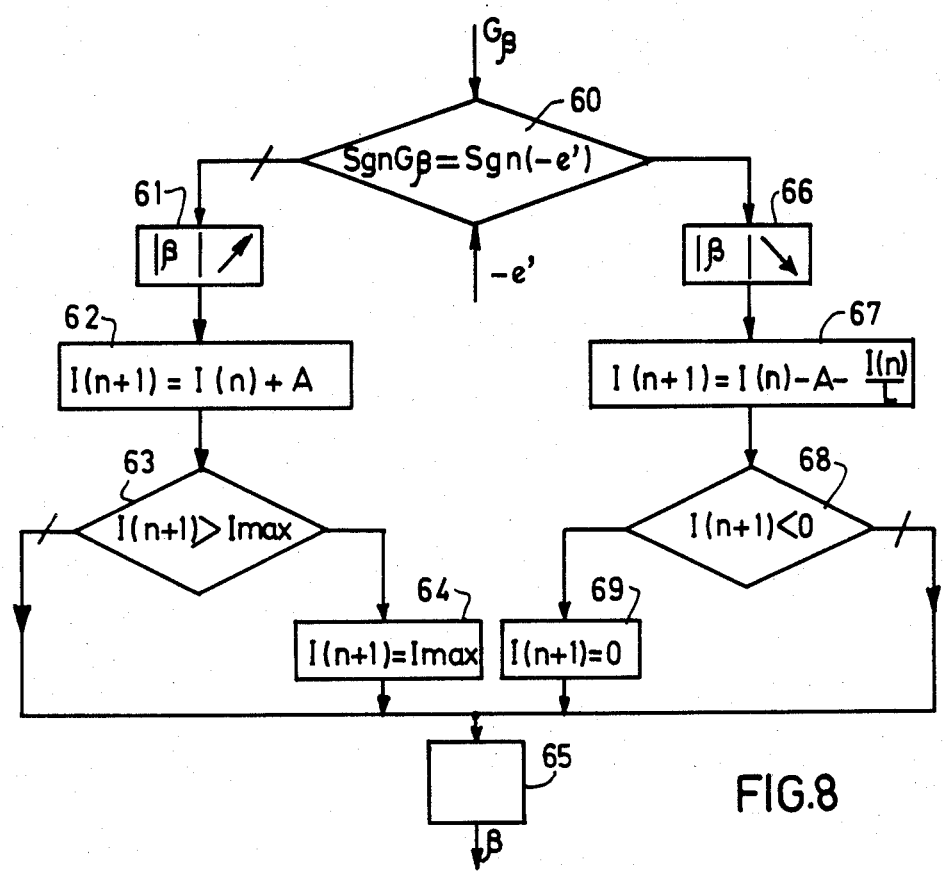
FIG. 8 is a flow chart of the operations to be performed for determining the coefficient of a filtering section with a controllable coefficient through the intermediary of an auxiliary variable.

The flow chart according to FIG. 8 shows the succession of the operations to be performed in the coefficient calculating circuits 52 and 152 to obtain a coefficient $\beta$ among the N coefficients $\beta_i$, when the iteration formulae (18) and (19) are used. In order to determine a new coefficient $\beta(n+1)$, first (box 60) a comparison of the signs of the gradients $G_\beta$ and the corresponding signal $-e'$ at instant nT is effected. Different signs (left-hand branch) indicate that the absolute value of the coefficient $\beta$ has to increase (box 61) and that the index I has to increase according to formula (18) (box 62). Subsequently, (box 63) the new value of the index $I(n+1)$ is tested in order to decide whether it exceeds the limit value $I_{max}$. If this condition is satisfied, the new retained value of the index is set as $I_{max}$ (box 64); it serves to read from a table 65 the limit value $-1+\epsilon$ of the new coefficient $\beta(n+1)$. If the condition $I_{(n+1)}>I_{max}$ is not satisfied, the new value of the index $I(n+1)$ is retained and serves to read directly from the table 65 the new value of the coefficient $\beta(n+1)$, which is a negative value and at most equal to $-1+\epsilon$. If the signs of $G_{62}$ and $-e'$ are the same, there the operations proceed as indicated by the right-hand branch of box 60. The absolute value of the coefficient $\beta$ has to decrease (box 66); the index has to increase according to formula (19) (box 67). Subsequently, there is tested whether the new value of the index $I(n+1)$ is negative (box 68). If the value $I(n+1)$ is negative, the new retained index value is $I_{min}=0$ (box 69), which value corresponds in table 65 to a coefficient equal to zero. If the value $I(n+1)$ is not negative. It serves to read directly from the table 65 a new value of the coefficient.

It should be noted that the iteration formula, (19) utilized to reduce the absolute value of the coefficients, causes the value of the new coefficients to depend upon its previous value. At the same time, a non-linear correspondence can be established between the values of the index and the values of the coefficients read from table 65. For example, it is sensible that equal index variations produce larger coefficient variations when these coefficients are close to zero and smaller variations when the coefficients are close to $-1$.

This technique, according to which an auxiliary variable (index) is used to perform the calculations, may be applied in an analogous manner in the general case represented in FIGS. 1 and 2, in which the filtering sections $F_i$ of the encoder and the decoder have two controllable coefficients $\alpha_i$ and $\beta_i$. In order to obtain stable filtering sections, these coefficients have to satisfy the conditions (2) mentioned above.

In order to calculate the indices $I_\alpha$ and $I_{62}$ relative to the coefficients $\alpha_i$ or $\beta_i$, iteration formulae may be utilized which are analogous to the formulae (18) and (19), the selected formula depending upon the respective signs of the signal $-e'$ and the gradients $G_{\alpha i}$ or $G_{\beta i}$. The flow charts of FIGS. 9 and 10 together represent the succession of the operations to be performed for obtaining a pari of coefficients $\alpha$ and $\beta$ among the N coefficients $\alpha_i$ and $\beta_i$.

Figure 9:
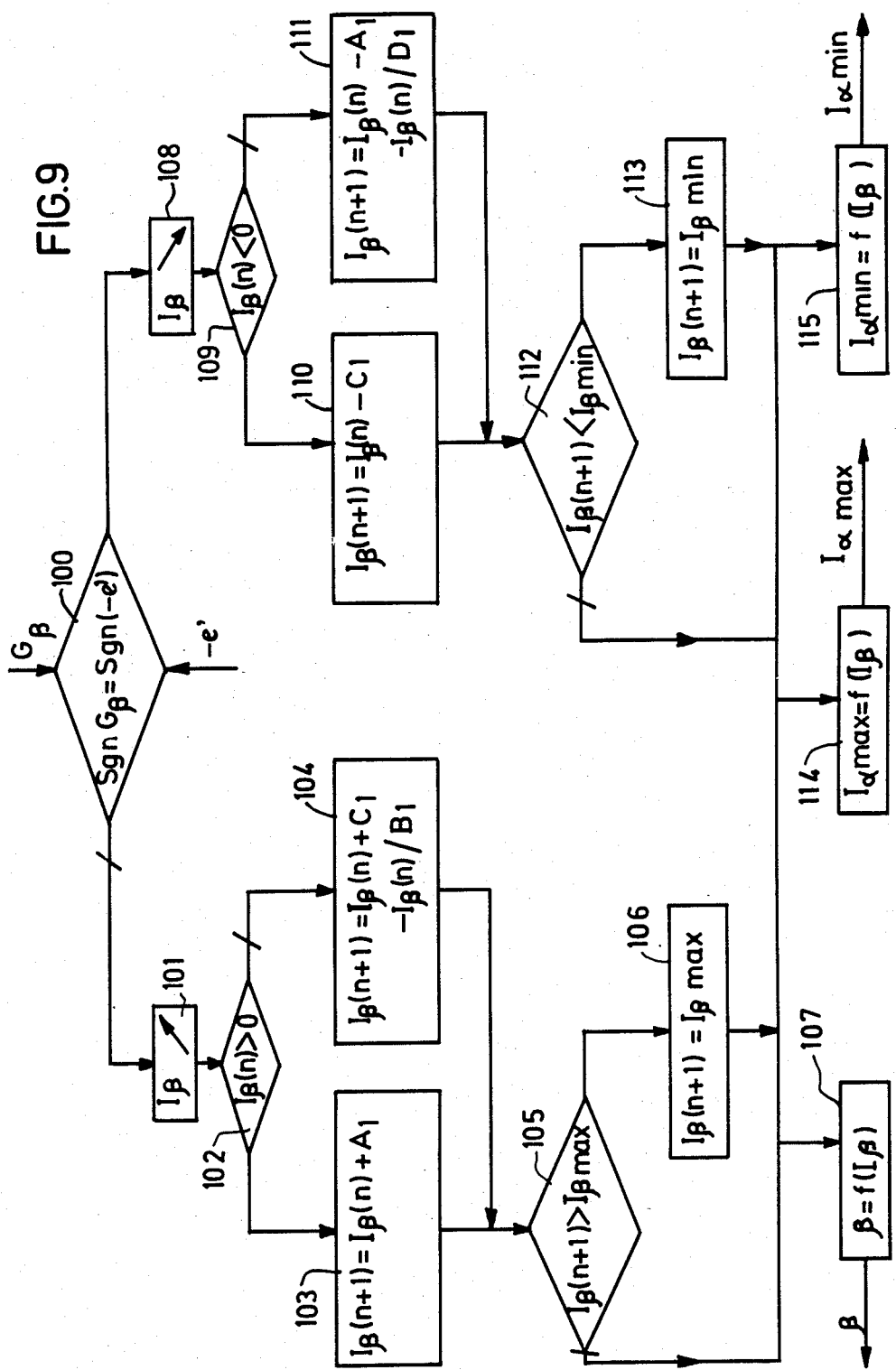
FIG. 9 and FIG. 10 together represent a flow chart of the operations to be performed for determining the pair of coefficients of a filtering section with two controllable coefficients through the intermediary of two auxiliary variables.

FIG. 9 mainly relates to the determination of a coefficient $\beta$. In order to determine a new coefficient $\beta(n+1)$, first it is treated in box 100 whether signal $-e'$ and gradient $G_\beta$ have the same sign. If these signs are different, the index $I_\beta$ relative to the coefficient $\beta$ has to increase: box 101. In box 102, it is tested whether the actual value $I_\beta(n)$ of the index is positive. If this is the case, the index is increased according to the interation formula $I_\beta(n+1)=I_{62}(n)+A_1$, $A_1$ being a positive quantity: box 103; if this is not the case, the index is increased according to the iteration formula $I_\beta(n+1)=I_\beta(n)+C_1-I_\beta(n)/B_1$, $B_1$ and $C_1$ being positive quantities (box 104). In both cases, it is tested (box 105) whether the new index $I_\beta(n+1)$ is higher than a maximum value $I_{\beta max}$. If the condition $I_\beta(n+1)<I_{\beta max}$ is satisfied, the new retained value of the index is set as $I_{\beta max}$: box 106; it serves to read from table 107 the maximum value of the coefficient $\beta$. If the condition $I_{\beta(n+1)}>I_{\beta max}$ is not satisfied, the new value of the index $I_\beta(n+1)$ is retained and serves to read directly from table 107 the new value $\beta(n+1)$ of the coefficient $\beta$. If the test performed in box 100 reveals that signal $-e'$ and gradient $G_\beta$ have the same sign, the index $I_{62}$ has to decrease: box 108. In box 109, it is tested whether the actual value $I_\beta(n)$ of the index is negative. If this is the case, the index is decreased according to the iteration formula $I_\beta(n+1)=I_\beta(n)-C_1$: box 110; if this is not the case, the index is decreased according to the iteration formula $I_\beta(n+1)=I_\beta(n)-A_1-I_\beta(n)/D_1$, $D_1$ being a positive quantity: box 111. In both cases, it is tested (box 112) whether the new index $I_\beta(n+1)$ is smaller than a minimum value $I_{\beta min}$. If $I_\beta(n+1)<I_{\beta min}$, the new retained value of the index is set as $I_{\beta min}$: box 113; it serves to read from table 107 the minimum value of the coefficient $\beta$. If the condition $I_\beta(n+1)<I_{\beta min}$ is not satisfied, the new value of the index $I_\beta(n+1)$ is retained and serves to read directly from table 107 the new value $\beta(n+1)$ of the coeffocient $\beta$.

Otherwise, the stability conditions (2) of the filtering sections show clearly that a maximum value and a minimum value of the coefficient $\alpha$ correspond to each value of a coefficient $\beta$. In an analogous manner, to each index value $I_\beta$, used to determine the coefficient $\beta$ there correspond maximum and minimum values $I_{\alpha max}$ and $I_{\alpha min}$ of the index $I_\alpha$ used to determine the coefficient $\alpha$. FIG. 9 consequently shows the tables 114 and 115, from which the maximum value $I_{\alpha max}$ and the minimum value $I_{\alpha min}$, respectively, of the index $I_\alpha$ are read for each index value $I_\beta$.

Figure 10:
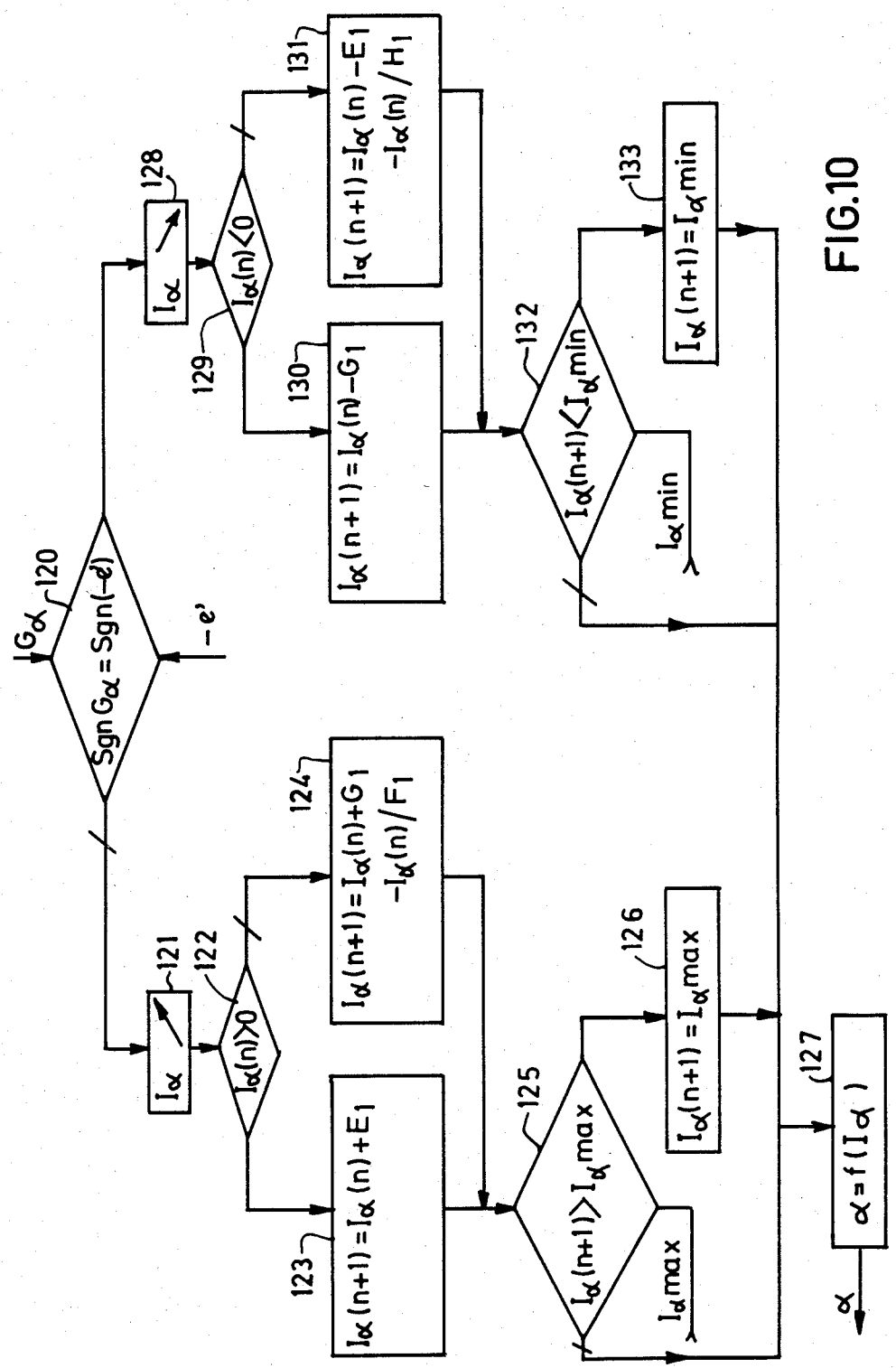

The flow chart of FIG. 10 relates to the determination of a coefficient $\alpha$. This flow chart is substantially the same as that of FIG. 9 and in the steps represented by the boxes 120 to 133, operations are performed which are identical or analogous to those performed in the steps represented by the boxes 100 to 113 in FIG. 9. In box 120, it is tested whether signal $-e'$ and gradient $G_\alpha$ have the same sign in order to determine whether the index $I_\alpha$ has to increase (box 121) or decrease (box 128). The succession of operations is the same as in the flow chart of FIG. 9 and terminates in reading of the values of the coefficient $\alpha$ from table 127 as a function of retained values of the new index $I_\alpha(n+1)$. The iteration formulae used in the boxes 123, 124, 130 and 131 have the same form as those used in the corresponding boxes 103, 104, 110 and 111, however, with quantities $E_1$, $F_1$, $G_1$, $H_1$ which may be different from the quantities $A_1$, $B_1$, $C_1$, D. On the other hand, it is noted that in the boxes 125 and 132, in which the conditions $I_a(n+1)>I_{amax}$ and $I_a(n+1)<I_{60\ min}$ are tested, the values $I_{amax}$ and $I_{amin}$ are not fixed but originate from tables 114 and 115 represented in FIG. 9.

It has been supposed in cascade constituting the filtering sections arranged in cascade constituting the local decoder of the encoder and the remote decoder, were of the recursive type. It is also possible to use filtering sections of the non-recursive type or a combination of filtering sections of the two types.

Figure 11:
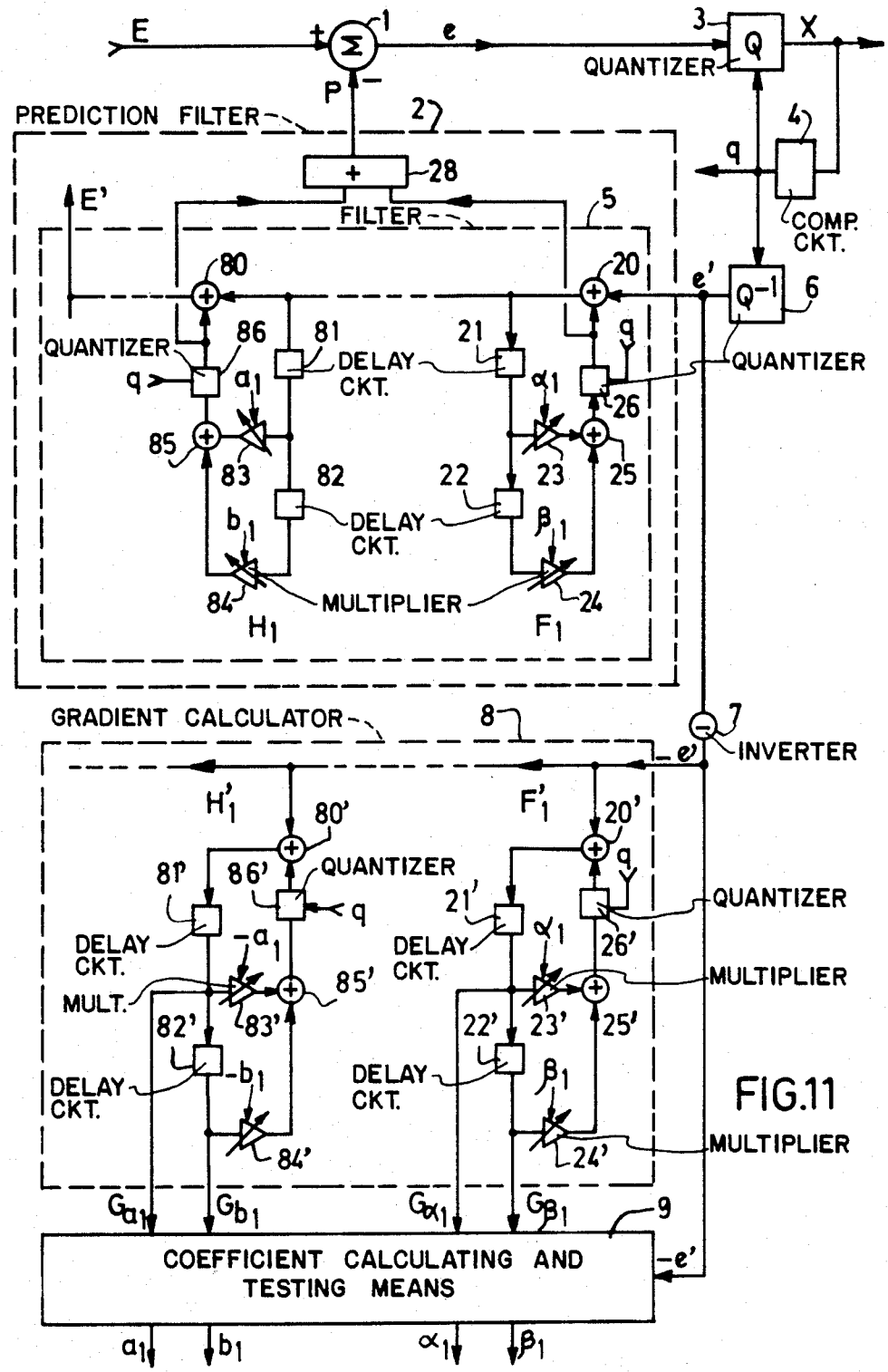
FIG. 11 shows an embodiment of the differential PCM encoder of the system according to the invention using recursive and non-recursive sections with two controllable coefficients.

FIG. 11 represents, for example, an encoder, whose filter 5 is composed, for example, of N recursive sections of the second order and L non-recursive sections of the second order. The recursive sections are of the same type as in FIG. 1, that is to say that their transfer function g(Z) corresponds to formula (1). For the sake of simplicity, only the first section $F_1$ has been represented, the elements of which are indicated by the same reference numerals as in FIG. 1 and in which two variable sections correspond to a transfer function of the type:

$$h(Z) = 1 + aZ^{-1} + bZ^{-2} \qquad (20)$$

a and b being the coefficients of these sections. For the sake of simplicity, only the first non-recursive section $H_1$ has been represented which comprises an adder 80 receiving an input signal and a signal derived from the input signal by means of delay circuits 81, 82; circuits 83, 84 for multiplying by the variable coefficients $a_1$, $b_2$; and adder 85; and a round-off quantizer 86. It should be noted here that, as is known, the same delay circuits can be used for pairs of recursive and non-recursive sections.

As has already been specified, the prediction signal P is obtained by forming, with the aid of adder 28, the sum of signals originating from filtering sections arranged in cascade; each of these signals is the signal in a respective (recursive or non-recursive) section which is added to the input signal of this section.

Taking into account the presence of L non-recursive sections using the coefficients $a_1$ to $a_L$ and $b_1$ to $b_L$, it can be shown that the above formula (8) becomes:

$$e = E \frac{(1 - \alpha_1 Z^{-1} - \beta_1 Z^{-2})(1 - \alpha_2 Z^{-1} - \beta_2 Z^{-2})\ldots(1 - \alpha_N Z^{-1} - \beta_N Z^{-2})}{(1 + a_1 Z^{-1} + b_1 Z^{-2})(1 + a_2 Z^{-1} + b_2 Z^{-2})\ldots(1 + a_L Z^{-1} + b_L Z^{-2})} \qquad (21)$$

the coefficients $\alpha_i$ and $\beta_i$ ($1 \leq i \leq N$) being those of the non-recursive sections and the coefficients $a_j$ and $b_j$ ($1 \leq j \leq L$) being those of the non-recursive sections.

It can be shown that the gradients $$G_{\alpha i} = \frac{\partial e}{\partial \alpha_i} \text{ and } G_{\beta i} = \frac{\partial e}{\partial \beta_i}$$

correspond to the formulae (9) and (10) given above and that the gradients $$G_{aj} = \frac{\partial e}{\partial a_j} \text{ and } G_{bj} = \frac{\partial e}{\partial b_j}$$

correspond to the formulae:

$$G_{aj} = \frac{-e(Z^{-1})}{1 + a_j Z^{-1} + b_j Z^{-2}} \qquad (22)$$

$$G_{bj} = \frac{-e(Z^{-2})}{1 + a_j Z^{-1} + b_j Z^{-2}} \qquad (23)$$

The formulae (22 and 23) show that the gradients $G_{aj}$ and $G_{bj}$, corresponding to the non-recursive sections, may be obtained by applying signal $-e$ to the recursive sections having a transfer function inverse to that of the non-recursive sections and by deriving the signals at the nodes of these recursive sections at which the output signal of these sections is delayed by T and 2T.

FIG. 11 shows how in circuit 8 the gradients $G_{60\ 1}$ and $G_{\beta 1}$ relative to the coefficients $\alpha_1$ and $\beta_2$ of the sections $F_1$, and the gradients $G_{a1}$ and $G_{b1}$ relative to the coefficients $a_1$ and $b_1$ of the section $H_1$ are calculated. The gradients $G_{\alpha 1}$ and $G_{\beta 1}$ are obtained exactly in the same manner as in FIG. 1 by applying signal $-e'$ to a section $F'_1$ identical to the section $F_1$ and by deriving the signals at the same nodes, the outputs of delay circuits 21' and 22'. The gradients $G_{a1}$ and $G_{b1}$ are obtained by applying signal $-e'$ to a recursive section $H'_1$ having a transfer function inverse to that of the section $H_1$. This section $H'_1$ comprises elements 81' to 86' having the same function as the elements 81 to 86 of the section $H_1$ and interconnected in the same manner, apart from the difference that the input of delay circuit 81' is connected to the output of adder 80' and that the coefficients utilized in multiplier circuits 83', 84' are the coefficients $a_1$ and $b_1$ changed as to their signs. The gradients $G_{a1}$ and $G_{b1}$ are available at the output of delay circuits 81' and 82'.

The coefficients $\alpha_i$, $\beta_i$ are controlled in circuit 9 by utilizing the iteration formulae (5) and (6); the coefficients $a_j$ and $b_j$ are also controlled by means of the iteration formulae (5) and (6), in which now the gradients $G_{aj}$ and $G_{bj}$ are utilized. Circuit 9 for controlling the coefficients can be quite similar to that of FIG. 5, without a distinction being made between the coefficients $\alpha_i$, $\beta_i$ and $a_j$, $b_j$.

In filter 5 of the encoder, there may also be used non-recursive sections having a transfer function h'(Z) of the form:

$$h'(Z) = 1 + b(dZ^{-1} + Z^{-2}) \qquad (24)$$

These non-recursive sections having a transfer function h'(Z) may be connected in cascade arrangement with the recursive sections having the transfer function g'(Z) of formula (11). The non-recursive sections of filter 5 having a transfer function H'(Z) with a variable coefficient $b_j$ and a fixed coefficient $d_j$, may be associated with gradient calculation sections having a transfer function $$\frac{1}{h'(Z)}$$

with a variable coefficient $b_j$ and a fixed coefficient $d_j$. In another modification, these non-recursive sections of filter 5 with a variable coefficient $b_j$ and a fixed coefficient $d_j$ may be associated with approximate gradient calculating sections having a transfer function $$\frac{1}{h''(Z)} = \frac{1}{1 + c_j(d_j Z^{-1} + Z^{-2})}$$

$c_j$ and $d_j$ being fixed coefficients. In these two modifications, the gradient $G_{bj}$ is obtained by deriving the signal at the node of the gradient calculation section at which the output signal is multiplied by $(dZ^{-1}+Z^{-2})$. The coefficients of the non-recursive sections can be determined from the signs of the signal $-e'$ and the gradients in the same manner as the coefficients of the recursive sections, especially by utilizing an index, as has been explained with reference to FIGS. 8, 9 and 10.

What is claimed is:

1. A digital information transmission system using differential pulse code modulation and comprising an encoder for converting an incoming linear PCM signal into a differential PCM signal with a reduced number of bits, and a remote decoder for carrying out the inverse conversion, the encoder comprising a difference circuit forming a difference signal between the incoming linear PCM signal and a prediction signal, a first quantizer operating with a quantizing step and quantizing the difference signal to form the differential PCM signal and a local decoder receiving the differential PCM signal and forming the prediction signal, the local decoder and the remote decoder being constituted in the same manner and comprising each a second quantizer operating inversely to said first quantizer of the encoder and a filter constituted by a cascade arrangement of filtering sections, each section being provided with a round-off (or truncation) circuit operating with a step equal to the quantizing step of the first quantizer, characterized in that the filters of the local decoder and the remote decoder comprise several filtering sections of the second order having two coefficients, at least one of which is controllable, the controllable coefficients of corresponding sections of the filter of the local decoder and the filter of the remote decoder being controlled by identical control circuits receiving the same signal derived from the differential PCM signal and comprising means for calculating the controllable coefficients by successive iterations so as to minimize a predetermined function of the difference signal produced in the encoder, as well as means for testing, for each section and at each iteration, whether each controllable coefficient affected by a calculated modification term is larger than an upper limit value or smaller than a lower limit value, said means for testing determining that these limit values are such that the poles of the transfer function in Z of said section lie just inside a circle of unit radius, the modified value retained for said controllable coefficient being the nearest limit value when the test is positive and being the value affected by the calculated modification term when the test is negative.

2. A transmission system as claimed in claim 1, characterized in that the encoder includes adding means and in that the prediction signal in the encoder is obtained by the adding means forming the sum of signals derived in said filtering sections, each of these derived signals being the signal in a respective filtering section which is added by said adding means to the input signal of this filtering section.

3. A transmission system as claimed in claim 1, characterized in that the modification term of each controllable coefficient of the filtering sections of the local decoder and of the remote decoder are calculated at each iteration as the product, weighted by a coefficient less than 1, of said signal derived from the differential PCM signal and the gradient of said difference signal with respect to the said controllable coefficient, each gradient being formed in a gradient calculation circuit which receives said signal derived from the differential PCM signal and which is provided with a round-off (or truncation) circuit operating with a step equal to the quantizing step of the differential PCM signal.

4. A transmission system as claimed in claim 1, characterized in that said signal derived from the differential PCM signal is obtained at the output of the inverse quantizer incorporated in the local decoder and the remote decoder.

5. A transmission system as claimed in claim 3, characterized in that the filters of the local decoder and the remote decoder comprise at least one recursive filtering section answering to a transfer function in Z of the type $$g(Z) = \frac{1}{1 - \alpha Z^{-1} - \beta Z^{-2}}$$

$\alpha$ and $\beta$ being the controllable coefficients of a section, the gradients $G_\alpha$ and $G_\beta$ being obtained by applying said signal derived from the differential PCM signal to a recursive gradient calculation section answering to the transfer function $g(Z)$ and by deriving signals at nodes of the gradient calculation section where the output signal of this section is delayed by T and 2T, T being the sampling period.

6. A transmission system as claimed in claim 3, characterized in that the filters of the local decoder and the remote decoder comprise at least one recursive filtering section answering to a transfer function in Z of the type $$g'(Z) = \frac{1}{1 - \beta(\delta Z^{-1} + Z^{-2})}$$

$\beta$ being a controllable coefficient and $\delta$ a fixed coefficient of a section, the gradient G being obtained by applying said signal derived from the differential PCM signal to a recursive gradient calculation section answering to the transfer function $g'(Z)$ with a fixed coefficient $\delta$ approximately equal to that of the corresponding section of the filters of the local decoder and the remote decoder, said gradient calculation section including multiplying means, said gradient being derived at a node of the gradient calculation section where the output signal of this section is multiplied by the function in Z of the type $(\delta Z^{-1}+Z^{-2})$ by said multiplying means.

7. A transmission system as claimed in claim 3, characterized in that the filters of the local decoder and the remote decoder comprise at least one recursive filtering section answering to a transfer function in Z of the type $$g'(Z) = \frac{1}{1 - \beta(\delta Z^{-1} + Z^{-2})}$$

$\beta$ being a controllable coefficient and $\delta$ a fixed coefficient of a section, the gradient $G_\beta$ being obtained by applying said signal derived from the differential PCM signal to a recursive gradient calculation section answering to the transfer function of the type $$g''(Z) = \frac{1}{1 - \gamma(\delta Z^{-1} + Z^{-2})}$$

with two fixed coefficients $\gamma$ and $\delta$, the latter being approximately equal to that of the corresponding section of the filters of the local decoder and the remote decoder, said gradient calculation section including multiplying means, said gradient being derived at a node of the gradient calculation section where the output signal of this section is multiplied by the function in Z of the type $(\delta Z^{-1} + Z^{-2})$ by said multiplying means.

8. A transmission system as claimed in claim 3, characterized in that the filters of the local decoder and the remote decoder comprise at least one non-recursive filtering section answering to a transfer function in Z of the type $h(Z) = 1 + aZ^{-1} + bZ^{-2}$, a and b being the controllable coefficients of a section, the gradients $G_a$ and $G_b$ being obtained by applying said signal derived from the differential PCM signal to a recursive gradient calculation section corresponding to the transfer function $1/h(Z)$, said gradient calculation section including delay means, said gradient being derived at nodes of the gradient calculation section where the output signal of this section is delayed by said delay means by T and 2T, T being the sampling period.

9. A transmission system as claimed in claim 3, characterized in that the filters of the local decoder and the remote decoder comprise at least one non-recursive filtering section answering to a transfer function in Z of the type $h'(Z) = 1 + b(dZ^{-1} + Z^{-2})$, b being a controllable coefficient and d a fixed coefficient of a section, the gradient $G_b$ being obtained by applying said signal derived from the differential PCM signal to a recursive gradient calculation section answering to the transfer function $1/h'(Z)$ with a fixed coefficient d approximately equal to that of the corresponding section of the filters of the local decoder and the remote decoder, said gradient calculation section including multiplying means, said gradient being derived at a node of the gradient calculation section where the output signal for this section is multiplied by the function in Z of the type $(dZ^{-1} + Z^{-2})$ by said multiplying means.

10. A transmission system as claimed in claim 3, characterized in that the filters of the local decoder and the remote decoder comprise at least one non-recursive filtering section answering to a transfer function in Z of the type $h'(Z) = 1 + b(dZ^{-1} + Z^{-2})$, b being a controllable coefficient and d a fixed coefficient of a section, the gradient being obtained by applying said signal derived from the differential PCM signal to a recursive gradient calculation section answering to the transfer function $$\frac{1}{h''(Z)} = \frac{1}{1 - c(dZ^{-1} + Z^{-2})}$$

with two fixed coefficients c and d, the latter being approximately equal to that of the corresponding section of the filters of the local decoder and the remote decoder, said gradient calculation section including multiplying means, said gradient being derived at a node of the gradient calculation section where the output signal of this section is multiplied by the function in Z of the type $(dZ^{-1} + Z^{-2})$ by said multiplying means.

11. A transmission system as claimed in claim 5, characterized in that for each filtering section answering to the transfer function in Z, $g(Z)$ or $h(Z)$, said limit values utilized at each iteration for testing the controllable coefficients $\alpha$ and $\beta$ or a and b are derived from the conditions $|\beta| < 1$ and $\beta - 1 < \alpha < -\beta + 1$ or $|b| < 1$ and $b - 1 < a < -b + 1$, which these coefficients have to satisfy in order that the poles of the function $g(Z)$ or the zeros of the function $h(Z)$ lie inside the circle of unit radius.

12. A transmission system as claimed in claim 5, characterized in that for each filtering section answering to the transfer function in Z, $g'(Z)$ or $h'(Z)$, said limit values utilized at each iteration for testing the controllable coefficient $\beta$ or b are derived from the conditions $$|\beta| < 1 \text{ and } |\delta| < \frac{|1 - \beta|}{|\beta|} \text{ or } |b| < 1 \text{ and } |d| < \frac{|1 - b|}{|b|}$$

which the controllable coefficient $\beta$ or b has to satisfy in order that the poles of the function $g'(Z)$ or the zeros of the function $h'(Z)$ lie inside the circle of unit radius.

13. A transmission system as claimed in claim 12, characterized in that the fixed coefficients $\delta$ or d of the filtering sections having a transfer function $g'(Z)$ or $h'(Z)$ are chosen so that $-2 \leq \delta \leq 2$ or $-2 \leq d \leq 2$, said limit values utilized at each iteration for testing the controllable coefficient $\beta$ or b being derived from the conditions $-1 < \beta \leq 0$ or $-1 < b \leq 0$.

14. A transmission system as claimed in claim 3, characterized in that, for each controllable coefficient, the circuit for controlling the coefficients comprises means responsive to the signs of the gradient and of said signal derived from the differential PCM signal for determining, at each iteration, the sense of variation of each controllable coefficient.

15. A transmission system as claimed in claim 14, characterized in that the circuit for controlling the coefficient further comprises means for calculating an auxiliary variable I corresponding to each controllable coefficient in accordance with iteration formulae, which at each iteration depend on the actual sign of said auxiliary variable and on said sense of variation of each controllable coefficient, and means for reading from a table the values of each controllable coefficient as a function of the values of the auxiliary variable.

16. A transmission system as claimed in claim 15, characterized in that, when a controllable coefficient has to increase, the corresponding auxiliary variable I is calculated according to the iteration formula $$I(n+1) = I(n) + A \text{ or } I(n+1) = I(n) + C - I(n)/B$$

according as the actual value I(n) is positive or not positive, and when a controllable coefficient has to decrease, the corresponding auxiliary variable I is calculated according to the iteration formula $$I(n+1) = I(n) - C \text{ or } I(n+1) = I(n) - A - I(n)/D$$

according as the actual value I(n) is negative or not negative, A, B, C and D being constant positive quantities.

17. A transmission system as claimed in claim 15, characterized in that the test to be performed at each iteration on each controllable coefficient of each filtering section is performed on the auxiliary variable corresponding to said controllable coefficient, the limit values of the auxiliary variable utilized for this test being derived from said limit values determined for the controllable coefficient.

* * * * *